United States Patent [19]

Kusuyama

[11] Patent Number: 5,869,901
[45] Date of Patent: Feb. 9, 1999

[54] SEMICONDUCTOR DEVICE HAVING ALUMINUM INTERCONNECTION AND METHOD OF MANUFACTURING THE SAME

[75] Inventor: Koichi Kusuyama, Gunma-ken, Japan

[73] Assignee: Nissan Motor Co., Ltd., Yokohama, Japan

[21] Appl. No.: 730,598

[22] Filed: Oct. 15, 1996

[30] Foreign Application Priority Data

Oct. 17, 1995 [JP] Japan .................................... 7-268172

[51] Int. Cl.$^6$ ............................ H01L 23/48; H01L 23/52
[52] U.S. Cl. ........................ 257/263; 257/764; 257/765; 257/767; 257/770; 257/771
[58] Field of Search .................................. 257/763, 764, 257/765, 767, 770, 771

[56] References Cited

U.S. PATENT DOCUMENTS

| | | | |
|---|---|---|---|
| 4,017,890 | 4/1977 | Howard et al. | 357/67 |
| 4,438,450 | 3/1984 | Sheng et al. | 257/771 |
| 4,989,064 | 1/1991 | Kubokoya et al. | 257/771 |
| 5,331,187 | 7/1994 | Ogawa | 257/771 |
| 5,360,996 | 11/1994 | Nulman et al. | 257/770 |
| 5,498,909 | 3/1996 | Hasunuma et al. | 257/771 |
| 5,581,125 | 12/1996 | Maeda | 257/770 |
| 5,641,992 | 6/1997 | Lee et al. | 257/771 |

FOREIGN PATENT DOCUMENTS

| | | |
|---|---|---|
| 0 716 447 | 6/1996 | European Pat. Off. . |
| 5-90268 | 4/1993 | Japan . |
| 7-130742 | 5/1995 | Japan . |

OTHER PUBLICATIONS

Onoda et al., "Analysis of Electromigration–induced Failures in High–temperature Sputtered Al–alloy Metallization", J. Vac. Sci. Technol. B 13(4), (1995), pp. 1546–1555.

"Formation of Texture Controlled Aluminum and Its Migration Performance in Al–Si/TiN Stacked Structure", Kageyama et al., IEEE 1991., p. 197.

The Effects of Al(111) Crystal Orientation on Electromigration in Half–Micron Layered Al Interconnects, Shibata et al., Japanese Journal of Applied Phys., vol. 32, (1993) pp. 4479–4484.

"Atomic Transportation in LSI Interconnection", preprint of Stress Problem Society, Thin Film Surface Symposium of Institute of Japanese Applied Physics, May 27, 1994, Tokyo pp.19–20.

"Generation of Amorphous Thin Film by Evaporation", Applied Physics, vol. 45, No. 12, pp. 1165–1171 (1976).

*Primary Examiner*—David Ostrowski
*Attorney, Agent, or Firm*—Foley & Lardner

[57] ABSTRACT

A semiconductor device and a method of manufacturing the same are provided which comprises a metal interconnection consisting of a titanium-aluminum film with (111) orientation formed on a semiconductor substrate via an insulating film, and an aluminum film or an aluminum alloy film with (111) orientation formed on the titanium-aluminum film by virtue of epitaxial growth. With such structure, electromigration endurance of an aluminum interconnection is improved and a wiring structure of a semiconductor is achieved with high reliability.

22 Claims, 24 Drawing Sheets

FIG.5
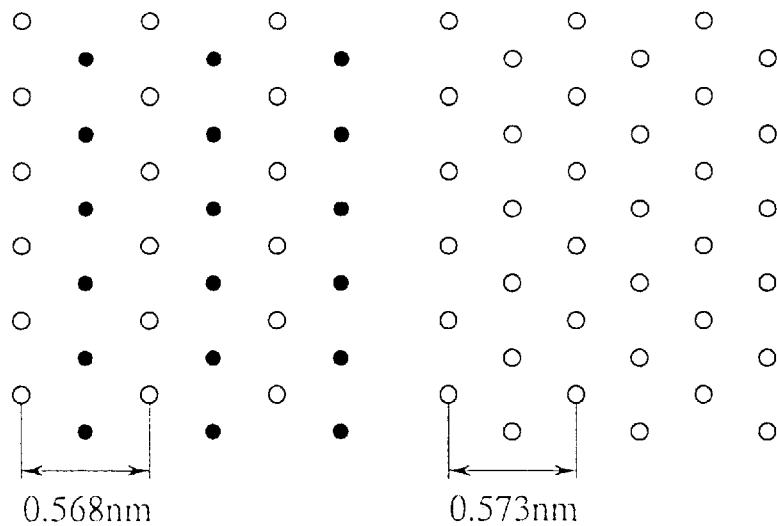
(a) TiAl FILM    (b) Al FILM
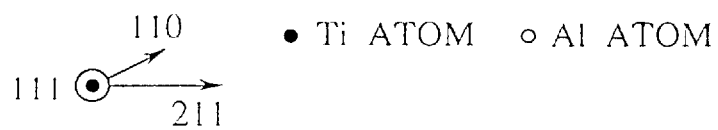
• Ti ATOM   ○ Al ATOM
$$\frac{\text{LATTICE CONSTANT OF TiAl FILM}}{\text{LATTICE CONSTANT OF Al FILM}} = \frac{0.568}{0.573} = 0.991$$

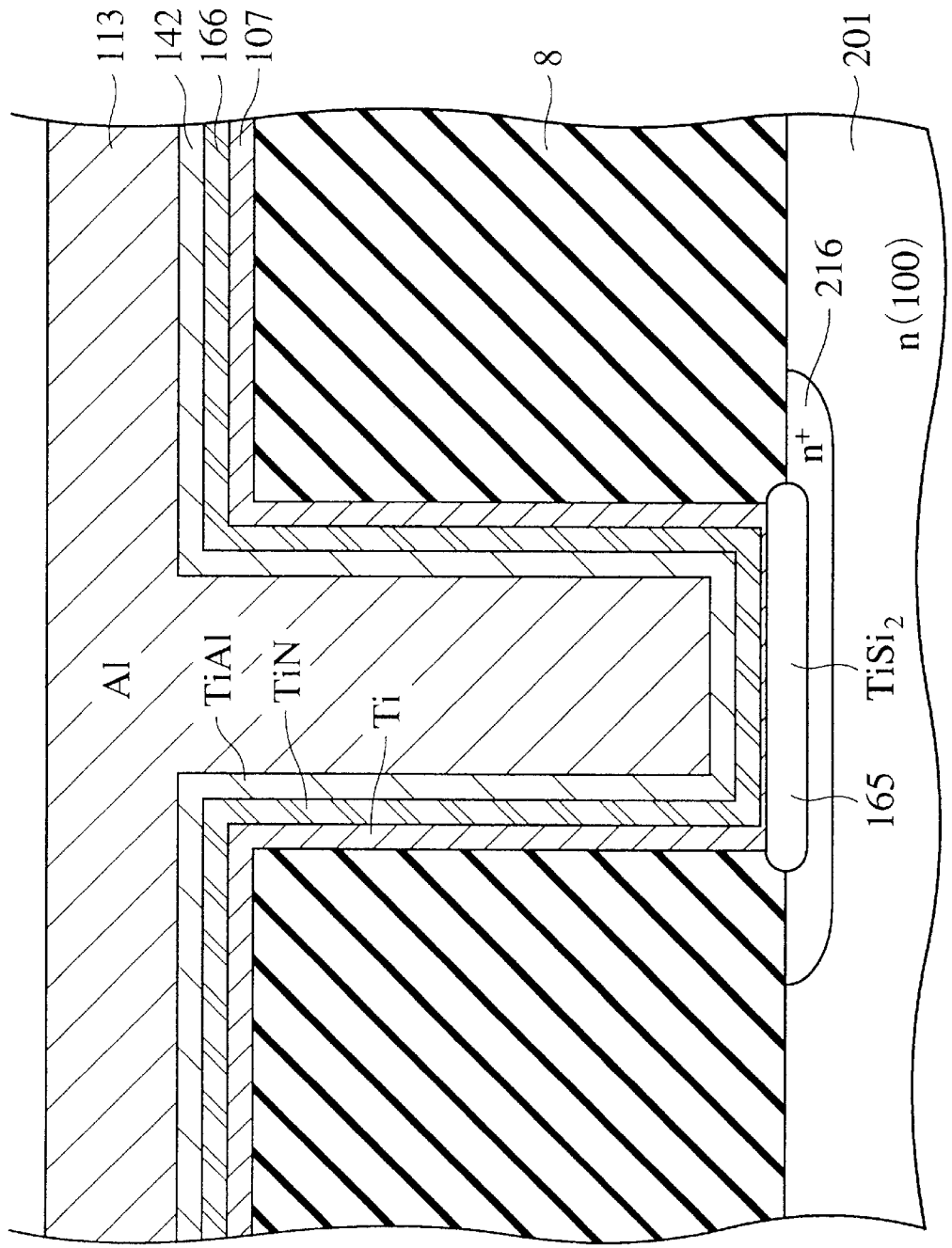

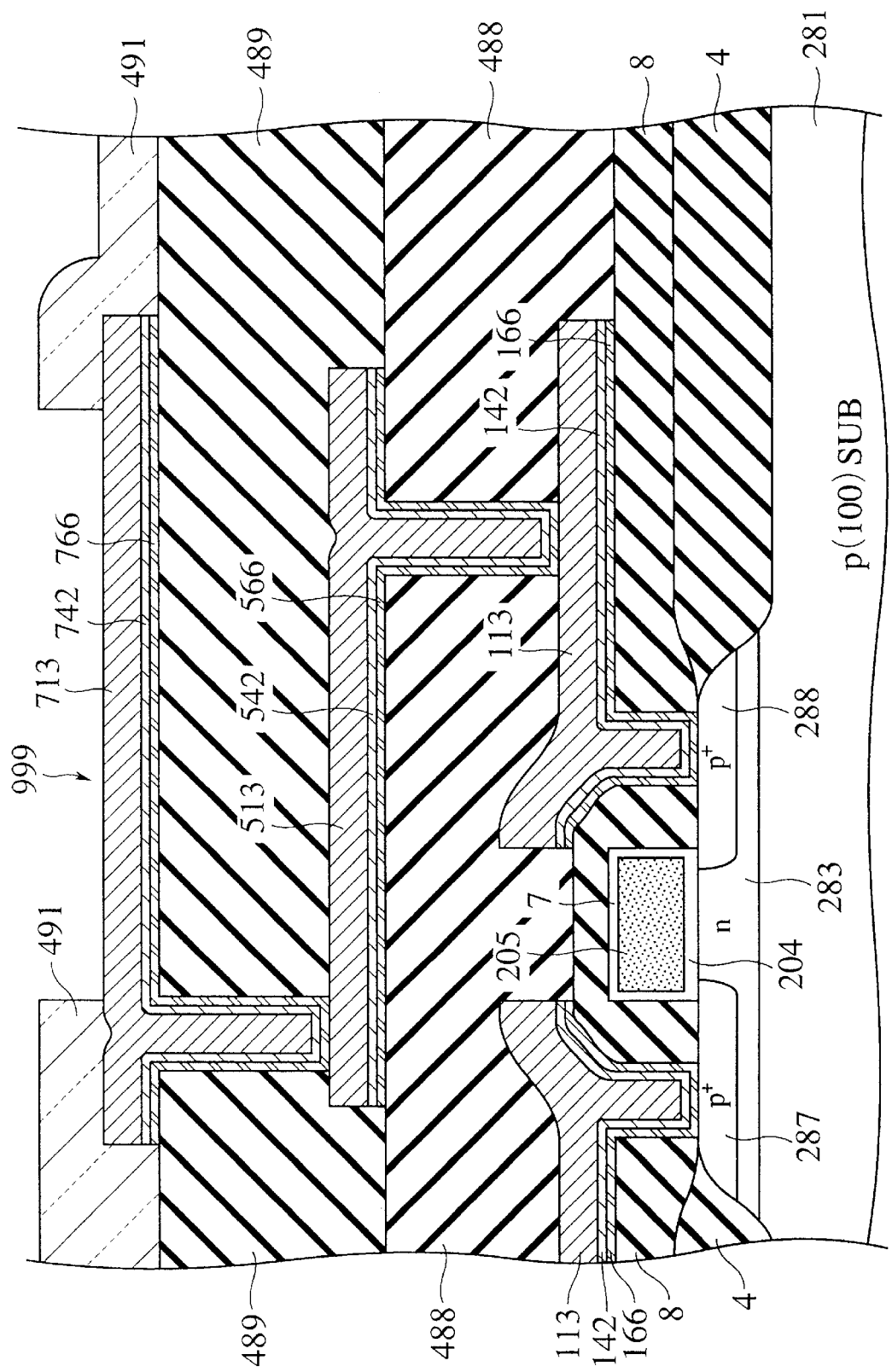

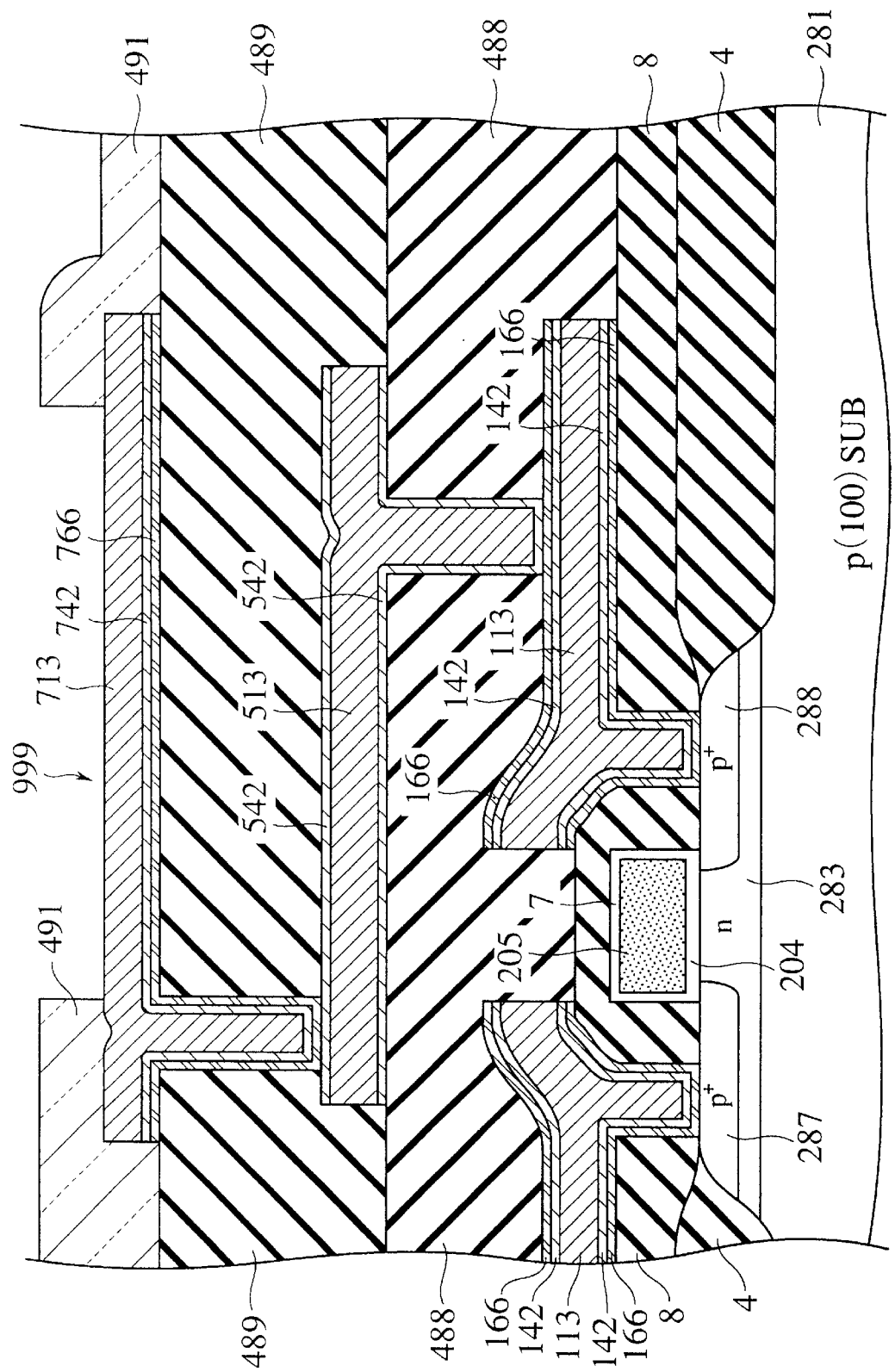

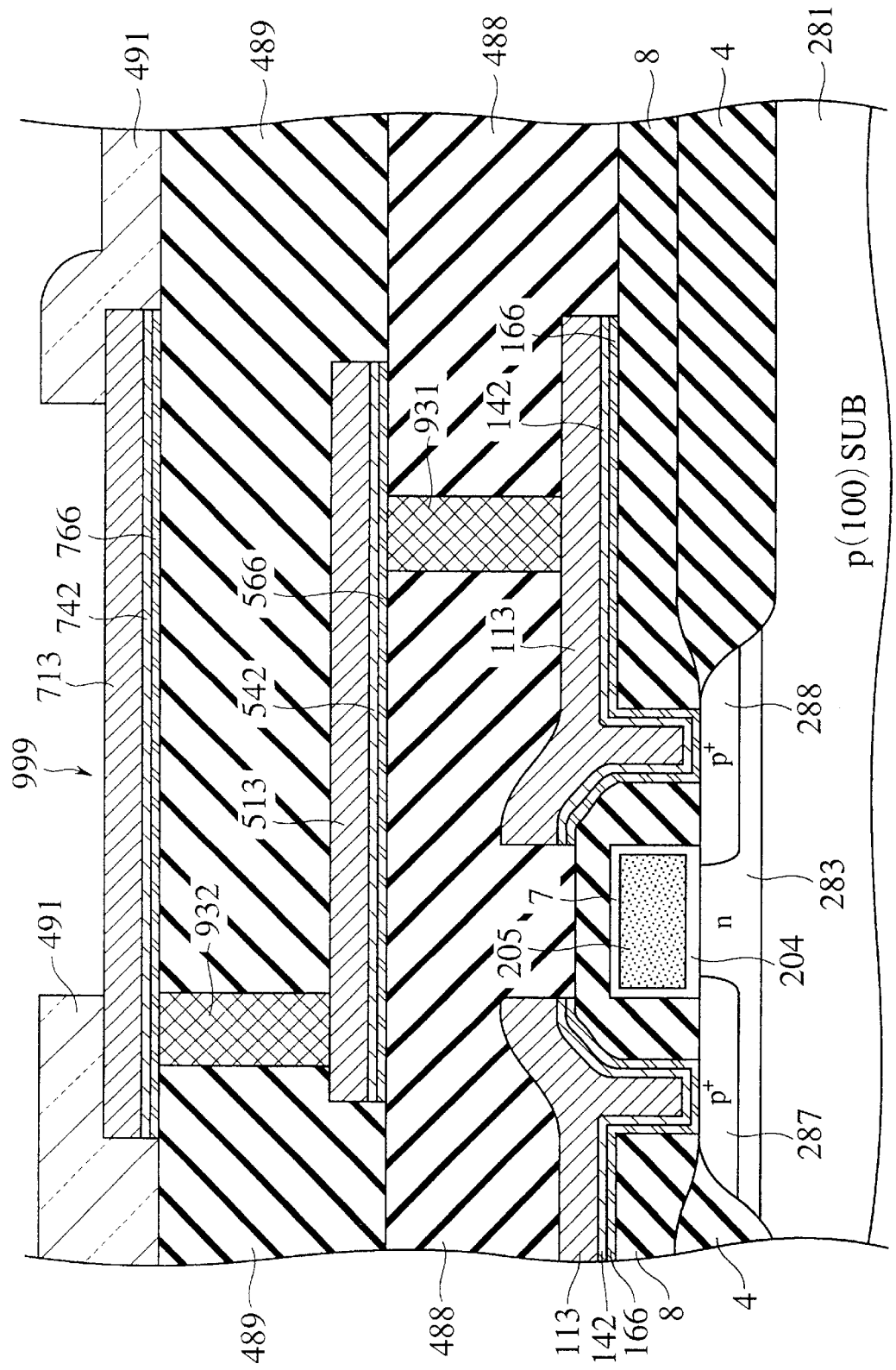

50nm

SEMICONDUCTOR DEVICE HAVING ALUMINUM INTERCONNECTION AND METHOD OF MANUFACTURING THE SAME

BACKGROUND OF THE INVENTION

1. Field of the Invention

The present invention relates to a semiconductor device having aluminum interconnection formed of an aluminum film or an aluminum-based alloy film on a surface of a semiconductor substrate.

2. Description of the Prior Art

As interconnection material for the semiconductor devices using semiconductors such as silicon (Si), usually aluminum (Al) film or aluminum alloy film which includes aluminum as a major component and includes silicon (Si), copper (Cu), palladium (Pd), titanium (Ti), scandium (Sc), boron (B), etc. is used. It has been well known that performance of such aluminum interconnection is degraded to reduce reliability due to "the electromigration phenomenon" that aluminum atoms are transported by electrons when a large current flows through the aluminum interconnection. Since such electromigration phenomenon is accelerated in compliance with increase in the current density in the wirings and increase in the temperature of the wirings, it causes a serious problem in the semiconductor devices, particularly, devices which are miniaturized like memory devices, i.e., highly integrated devices or power devices for supplying high density current.

As for an aluminum interconnection for the semiconductor device having high electromigration endurance, aluminum alloy film in which copper, etc. are added into the aluminum film and the like, are used in the prior art. Various improvements have already been proposed. Particularly, it has been known that, when orientation of the aluminum film is evaluated by X-ray diffraction, the aluminum film having high (111) orientation exhibits high electromigration endurance. That finding has been known in the literature [Proc. of 29th International Reliability Physics Symposium, 1991, p.97] reported by Kageyama et al. and the literature [Japanese Journal of Applied Physics, Vol.32 (1993), pp.4479–4484] by H. Shibata et al., for example. In addition, the relationship between FWHM (Full Width at Half Maximum) of the X-ray diffraction peak from aluminum (111) plane and electromigration endurance has been disclosed in the literature [Atomic Transportation in LSI Interconnection, preprint of Stress Problem Society, pp.19–20, Thin Film/Surface Symposium of Institute of Japanese Applied Physics, May 27 1994, Tokyo] reported by Toyoda et al. It has been known that electromigration endurance becomes high as the aluminum interconnection has narrower FWHM of (111) peak by X-ray diffraction.

In general, if (111) surfaces formed as a closely packed surface is used as the surface and boundary surface in the face-centered cubic lattice of the crystal structure, the aluminum interconnection may take (111) orientation since energy of system can be minimized. However, in an aluminum film formed on the silicon oxide film, the extent of the (111) orientation is low and therefore FWHM of (111) peak by X-ray diffraction is as wide as several degrees. This result is due to the following causes.

More particularly, in the manufacturing steps of the semiconductor device, heating temperature of the semiconductor substrate in forming the aluminum film is relatively high, although it is lower than melting point of aluminum or aluminum alloy. For this reason, before the aluminum film is grown as a continuous film, it grows in an island-like fashion, as shown in FIG. 1, at the initial process of a film forming step for the aluminum film. At this time, the surface of the island-like aluminum film 57 forms (111) surface which is most stable in respect of energy. Between the surface of the insulating film 4 as the under-layer and the (111) surface of crystals in the island-like aluminum film 57, there exists an inclination angle determined by the wetting angle, or the contact angle between the aluminum film and the under-layer. For example, an inclination angle of several degrees is obtained if the silicon oxide film is used as the under-layer for the aluminum film. After the aluminum film has been grown as the continuous film with the progress of the aluminum film formation, the surface of the insulating film 4 and the surface of the aluminum film become parallel. However, since relationship between the surface of the insulating film 4 and the (111) surface of the aluminum film is held at the initial state of the aluminum film formation, the surface of the aluminum film and the (111) surface takes an inclination angle of several degrees. In such an aluminum film, when crystal orientation parallel to the surface is measured by X-ray diffraction, intensity for the (111) orientation is weak and electromigration endurance is low. This finding has been widely known in the report proposed by Toyoda et at., for example.

As an example of such aluminum film, aluminum (111) reflection rocking curve measured by X-ray diffraction is shown in FIG. 2 when the 50 nm thick silicon thermal oxide film is formed on the silicon substrate, and the 2 $\mu$m thick Al-1% Si film are formed by DC magnetron sputtering. It can be found from the rocking curve that (111) surface of the crystals in the aluminum film is inclined relative to the surface of the aluminum film by an average of 4.5 degrees and that the FWHM of the peak of (111) reflection rocking curve is as wide as about 6.7 degrees so that crystallographic quality of the aluminum film is not always good.

As the approach to improve the degree of (111) orientation of the aluminum film, there are three known approaches, i.e., (a) The aluminum film is epitaxially grown on the titanium nitride (TiN) film which has a lattice constant close to that of the aluminum film, (b) The non-crystalline film (or the amorphous film) is used as the under-layer, and (c) The metal film which is highly reactive to Al is used as the under-layer.

These three approaches will be explained hereinbelow.

(a) It has been known in the report by Kageyama et al. to have the aluminum film epitaxially grown on the titanium nitride (TiN) film which has a lattice constant close to that of the aluminum film (first approach). This approach is intended to improve the degree of (111) orientation of the aluminum film by epitaxially growing the aluminum film on the titanium nitride (TiN) film which has (111) preferred orientation like the aluminum film and has a lattice constant (0.4239 nm) close to that (0.4049 nm) of the aluminum film.

However, the following problems reside in this first approach. First, in this approach wherein the aluminum film is epitaxially grown on the titanium nitride (TiN) film which has a lattice constant close to that of the aluminum film, there is a problem that mismatching between the lattice constant (0.4239 nm) of the titanium nitride film and the lattice constant (0.4049 nm) of the aluminum film is as large as about 4.5%. Although the film can as a rule be epitaxially grown so far as lattice mismatching between the under-layer and the film to be formed is within about 5%, the crystallographic quality and the degree of orientation of the film to be formed is degraded with increase of the lattice mismatching. Therefore, it can be concluded that to use the titanium nitride (TiN) film is not always sufficient from a view point of improving the degree of orientation of the aluminum film by virtue of epitaxial growth.

(b) Next, it has been known in the report by Toyoda et al. to use the amorphous film as the under-layer (second approach). This second approach intends to improve the degree of (111) orientation of the aluminum film by changing the growth mechanism of the aluminum film from island-like growth into layer-like growth by means of increasing surface energy of the under-layer at initial stage of the aluminum film formation.

However, a problem existing in the second approach is that it is difficult to form non-crystalline film without degrading "the degrade step coverage" of the aluminum film. More particularly, there has been known to use precipitation method, quenching method, condensation method, and others as the method of forming the non-crystalline film (amorphous film). In any method, substrate temperature must be set lower than crystallization temperature of the amorphous material during forming the amorphous under-layer film and during forming the aluminum film. This finding has been known in the article by Kinbara et al., i.e., ["Generation of Amorphous Thin Film by Evaporation" Applied Physics, Vol.45, No 12, pp.1165–1171, 1976]. In general, crystallization temperature of the metal is lower than that of oxide, etc. For example, for Cr metal it is 220° K. (absolute temperature), and Sn—Cu alloy has about 60° K. For this reason, since the substrate has to be cooled to form the non-crystalline film water or a cooling equipment, cooling apparatus with the use of liquid nitrogen or liquid helium must be equipped. Upon forming the aluminum film on the non-crystalline film, the aluminum film must be formed at the low temperature so as not to crystallize the amorphous film. Therefore, raising the temperature of the substrate with a view to improve step coverage in the recessed portions is limited. In general, although methods of forming the film in vacuum or under low pressure such as vacuum sputtering or evaporation may be used as the method of forming the aluminum film for use in interconnection of the semiconductor device, raising the temperature of the substrate is limited with a view to improve the quality of vacuum if the non-crystalline film is used as the under-film. The second approach is not preferable in this respect.

(c) It has been proposed in Patent Application Publication (KOKAI) 5-90268 to use the metal film which is highly reactive to Al as the under-layer (third approach). This third approach can be enabled since flat growth is advantageous with respect to energy in contrast to aluminum grown at the initial stage is grown in an island-like fashion by combining with each other if the metal film which is highly reactive to Al is located in the under-layer. The aluminum film to be grown flat is formed as a uniaxial orientation film in which (111) surfaces having smallest surface energy of Al are orientated.

However, in the third approach, there is an upper limit in a thickness of the under-metal. In other words, it has been known that rugged surface appears on the under-metal film and therefore the degree of (111) orientation of the Al film formed on the under-metal film is degraded when a thickness of the under-metal film exceeds 50 nm. Such an upper limit in a thickness of the under-metal causes insufficient barrier in the contact hole if the under-metal film is used as the barrier metal between Al and silicon. In the semiconductor device in which contact holes having high aspect ratio are formed, if the upper limit in the thickness of the under-metal film on the flat portion, it is hard to form the under-metal film having a sufficient thickness on the bottom portions and side wall portions of the contact holes. In some cases, uncontinuous under-metal film is formed. Such noncontinuous under-metal film and such under-metal film having an insufficient thickness on the bottom portions and side wall portions of the contact holes is not preferable since they would cause reduction in barrier characteristic or island-like growth of aluminum at the initial stage of growth process of the aluminum film.

SUMMARY OF THE INVENTION

The present invention has been made to overcome the above problems in the prior art, and an object of the present invention is to provide an aluminum interconnection having high electromigration endurance and a semiconductor device which has the aluminum interconnection and achieves high reliability.

Another object of the present invention is to provide a method of manufacturing a semiconductor device having an aluminum interconnection with high electromigration endurance.

A first feature of the semiconductor device of the present invention resides in that, as shown in FIG. 3B, a metal interconnection portion is formed by a conductive layer consisting of a titanium-aluminum (TiAl) film 142 with (111) orientation and an aluminum (Al) film 143 with (111) orientation and formed on the TiAl film 142 by virtue of epitaxial growth.

More particularly, as a basic conception of the present invention, according to the multilayed structure shown in FIG. 3B, the degree of Al (111) orientation can be improved and electromigration endurance can be improved by narrowing the FWHM in X-ray diffraction spectra. In the semiconductor device having the Al interconnection of the present invention, such an event is defined as "epitaxial growth" in that plural crystal surfaces are grown in parallel on the under-layer and the film formed on the under-layer. Therefore, in case the Al film with (111) preferred orientation is epitaxially grown on the TiAl film with (111) preferred orientation, a TiAl (111) surface and an Al (111) surface are formed in parallel to the boundary surface between the TiAl film and the Al film, but adjacent crystal surfaces of TiAl crystal grains and Al crystal grains except for (111) surfaces are not always parallel to each other if individual crystal grains forming the TiAl film and the Al film are observed. This is due to a difference in size of crystal grains forming the TiAl film and the Al film and difference in individual melting points.

The TiAl film which is formed by the ordinary thin film forming apparatus, for example, DC magnetron sputter apparatus used to manufacture the semiconductor device, has small crystal grains in contrast to the Al film. If the Al film is formed on the TiAl film by virtue of epitaxial growth, crystal surface of TiAl crystal grains coincide with that of Al crystal grains in the initial process of film formation, i.e., in a period when the TiAl crystal grains and the Al crystal grains have substantially same sizes. However, if the Al film thickness is increased, adjacent Al crystal grains are combined with each other to thus form larger crystal grains, so that boundary area per unit volume is reduced. As a result, surface/boundary energy is made smaller to be settled into stable state. At this time, (111) orientation is not changed because the surface is kept at the (111) surface. On the other hand, since the TiAl film has a high melting point rather than the Al film, enhancement of crystal grain diameter due to recombination of crystal grains is not caused at the temperature for heating the substrate when aluminum is formed, i.e., at less than 600° C. Therefore, in the Al crystal grains combined with adjacent crystal grains, though (111) surfaces of crystal surfaces of the crystal grains of the TiAl film as the under-layer are parallel to (111) surfaces of crystal surfaces of the crystal grains of the Al film as the upper layer, other crystal surfaces are not in parallel. On the contrary, the crystal grains combined with adjacent Al crystal grains, or at least a part of such crystal grains, have parallel crystal surfaces to the crystal grains of the TiAl film except for the (111) surfaces. With the above, according to the aluminum interconnection structure of the present invention, it is defined as "epitaxial growth" in a broader sense that plural crystal surfaces, mainly (111) surfaces are grown in parallel in the under-layer and the film formed on the under-layer.

The first feature of the present invention is based on the experimental results as follows. In the sample used in the experiment, the 50 nm thick silicon thermal oxide film is formed as the insulating film on the Si (100) substrate as the semiconductor substrate, and the 100 nm thick Ti film and the 2 $\mu$m thick Al-1% Si film are formed by DC magnetron sputtering. Next, orientation of the Al—Si film, FWHM in the X-ray diffraction spectra indicating the orientation of the Al—Si film, and reactivity of the Al—Si film and the Ti film of the sample have been evaluated. As a result, it has been found that (111) orientation of the Al—Si film of the sample is extremely good and the FWHM is narrow. FIG. 13 shows the Al—Si (111) surface reflection rocking curve obtained by X-ray diffraction. The measurement has been made under the same condition as the above case shown in FIG. 2 (prior art). It can be seen that, in contrast to the Al (111) surface reflection rocking curve shown in FIG. 2 wherein the silicon oxide film is used as the under-layer, the (111) surface of the Al—Si film is formed in parallel to the surface of the Al—Si film and the FWHM of the peak is as narrow as about 0.97 degrees to show high degree of (111) orientation in the case wherein the Ti film is used as the under-layer. In FIG. 13, peak X-ray intensity of (111) surface reflection is 65 k (count/sec) which is stronger than 16 k (count/sec) in FIG. 2 without the TiAl film as the under-film. High (111) orientation can be proved from this respect.

FIG. 14A is a sketch showing the cross-sectional transmission electron microscope (TEM) view of the Al film formed on the Ti film. FIG. 14B is a sketch showing the electron diffraction pattern of the Al film formed on the Ti film. FIG. 14A shows the sketch drawing of the cross-sectional TEM view of the sample having the Ti film 107 as the under-film, wherein the oxide film 8, the Ti film 107, the TiAl film 142, and the Al—Si film 143 are stacked on the silicon substrate 201. From the results of the electron diffraction view around the boundary between the Ti film 107 and the Al—Si film 143 shown in FIG. 14B, it has been found that the sample has the three-layered structure consisting of the Ti film 107, the TiAl film 142, and the Al—Si film 143, and the (111) surface of the TiAl film 142 and the (111) surface of the Al—Si film 143 are formed in parallel, and the Al—Si film 143 is epitaxially grown on the TiAl film 142. In the present invention described above, if crystals can be grown to have predetermined orientation, such growth can be expressed as "epitaxial growth" even when polycrystal aluminum film is grown on polycrystal titanium-aluminum film.

In addition, since the experimental sample of the present invention is not annealed after the Al—Si film is deposited, the TiAl film 142 observed in FIG. 14A may be formed by reaction between the Ti film 107 and Al atoms impinging on the Ti film by sputtering, at the initial stage of the Al—Si film 143 deposition on the Ti film 107 at a substrate temperature of 260° C.

With the above, inventors of the present invention have found the fact that, when the Al—Si film is formed on the Ti film 107 at a substrate temperature of 260° C., the TiAl film with (111) preferred orientation is formed on the boundary between the Ti film and the Al—Si film and therefore (111) orientation of the Al—Si film is significantly excellent. The present invention has been made based on this fact.

FIG. 4 shows evaluation results of electromigration endurance with respect to the Al-1% Si film in the prior art and the Al-1% Si film with high (111) orientation which is epitaxially grown according to the present invention.

As shown in FIG. 4, it would be understood that, in contrast to the Al-1% Si film in the prior art, the epitaxially grown Al-1% Si film with high (111) orientation on the TiAl film according to the present invention has extremely long life time and small variation in life time.

Furthermore, if the TiAl film is used as the under-layer, better lattice matching can be achieved rather than conventional lattice matching between the titanium nitride (TiN) film (lattice constant: 0.4239 nm) and the Al film (lattice constant of Al (111) surface/lattice constant of TiN (111) surface=about 95.5%), and as a result the Al film with higher (111) orientation can be formed. The lattice matching between the Al film and the under-layer and (111) orientation of the Al film have been reported in the above-mentioned H. Shibata et al. and others.

In the first feature of the present invention, as shown in FIG. 8C, if Ti film is formed between the TiAl film 442 and the insulating film 488, the TiAl film 442 to be formed on the Ti film 441 to have (111) preferred orientation can be easily formed. Therefore the aluminum or aluminum alloy interconnection structure which has high (111) orientation, excellent electromigration endurance, and high reliability can be obtained.

A second feature of the semiconductor device of the present invention resides in that, as shown in FIGS. 10, 11A to 11D, if the TiN film 166 or the two-layered film composed of the TiN film 166 and the Ti film 107 is provided on the insulating film 8, then the TiAl 142 with (111) orientation is formed thereon, and then the Al film or Al alloy film 113 with (111) orientation is formed on the TiAl 142.

In the second feature of the present invention, like the first feature of the present invention, the present invention is excellent in electromigration endurance since (111) orientation of the Al film or Al alloy film 113 is good. Besides, the structure according to the second feature of the present invention may be applied to the contact hole portion shown in FIG. 10. In other words, failures due to alloy pits generated on the boundary between the semiconductor substrate 201 and the metal interconnection as well as silicon solid phase epitaxial growth can be suppressed, or controlled by the TiN film 166.

In addition, no problem of an upper limit of the thickness of the under-metal film exists, which is the problem in the conventional method using a highly reactive metal to Al as the under-film. In other words, in the prior art, if highly reactive metal to Al is used as the under-film, poor morphology appears on the surface of the under-metal film and therefore the degree of (111) orientation of the Al film formed on the under-metal film is degraded when a thickness of the under-metal film exceeds 50 nm. However, in the present invention, since the TiAl film is formed on the TiN/Ti film and then the Al film is formed thereon by virtue of epitaxial growth, it is possible to improve the degree of (111) orientation of the Al film even if the Ti film of 100 nm in thick is applied as the under-layer, for instance. Thus, a thickness of the under-metal film can be assured sufficiently. Namely, the sufficiently thick under-metal film is applied as the barrier metal between the Al layer and silicon in the contact portion shown in FIG. 10.

Even in the semiconductor device in which contact holes (trenches) having high aspect ratios are formed, the under-metal film having a sufficient thickness can be formed on the bottom portions and side wall portions of the contact trenches and the aluminum film with strong (111) orientation can be formed regardless of a thickness of the under-metal film on the flat portion.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing the invention in practice.

BRIEF DESCRIPTION OF THE DRAWINGS

FIG. 5 is a diagrammatic representation illustrating lattice constants of the titanium-aluminum film (a) and the aluminum film (b) for comparison according to the present invention;

FIG. 10 is an enlarged sectional view showing a metal interconnection around a contact hole according to a third embodiment of the present invention;

FIGS. 12A to 12D are sectional views showing multilayered metal interconnection according to a fifth embodiment of the present invention;

DETAILED DESCRIPTION OF THE EMBODIMENTS

Figure 1:
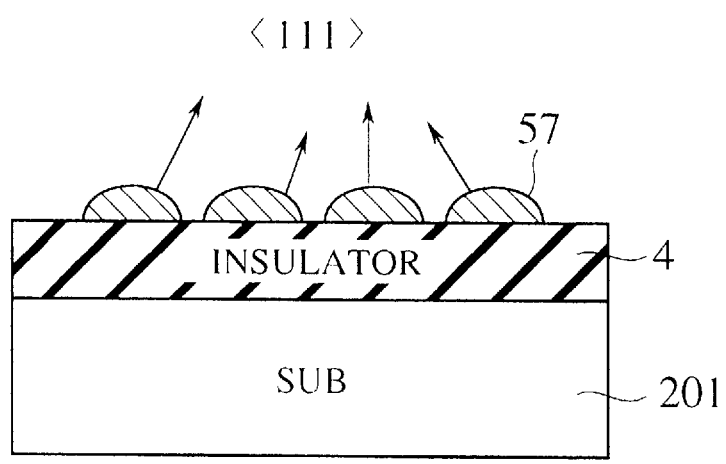
FIG. 1 is a schematic view showing a film forming state in the initial stage of growth process in the prior art if an aluminum film is formed on an insulating film.
Figure 2:
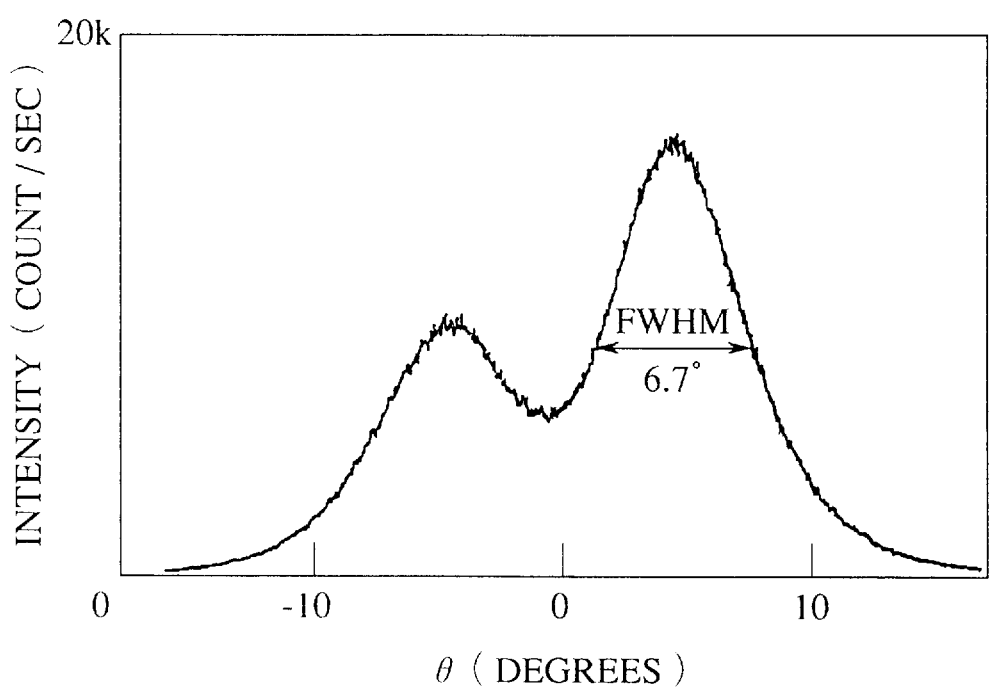
FIG. 2 is a graph showing an X-ray diffraction rocking curve an Al-1% Si film formed on a silicon oxide film in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as it is conventional in the representation of semiconductor devices, it will be appreciated that the various drawings are not drawn to scale from one figure to another nor inside a given figure, and in particular the layer thickness are arbitrarily drawn for facilitating the reading of the drawings.

First Embodiment

Figure 3A:
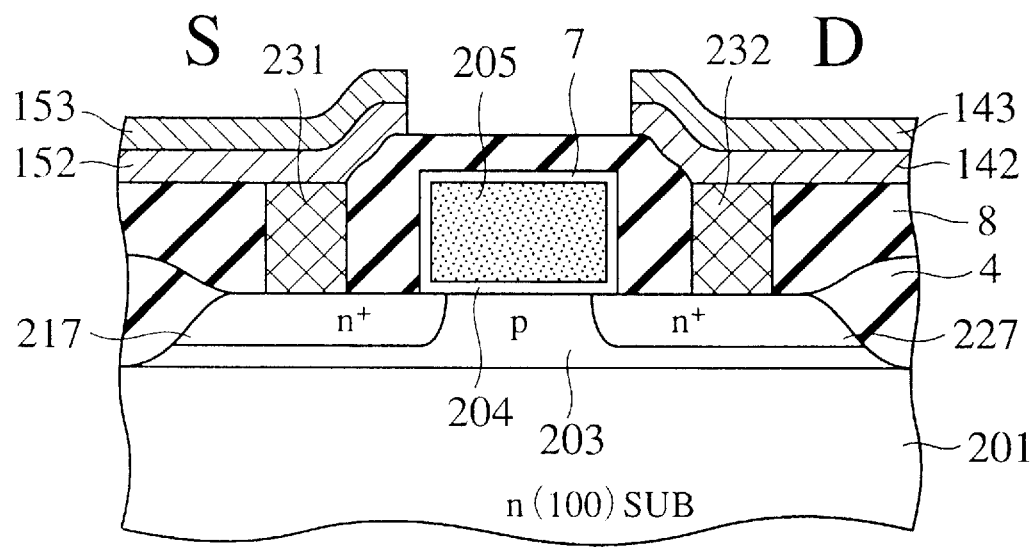
FIG. 3A is a sectional view showing a MOSFET according to a first embodiment of the present invention.

FIG. 3A is a sectional view showing a MOSFET having an aluminum interconnection according to a first embodiment of the present invention. In FIG. 3A, a p well 203 is formed on an n type (100) silicon substrate 201. The p well 203 is device-isolated by a thermal oxide film 4 which is formed deeply to reach the n type (100) silicon substrate 201 from a surface of the p well 203. In a device-isolated region of the p well 203 serving as an active region, an n$^+$ source region 217 and an n$^+$ drain region 227 are formed. A gate electrode 205 formed of polysilicon or the like is formed over a channel region 203 between the n$^+$ source region 217 and the n$^+$ drain region 227 via a gate oxide film 204. A thin oxide film 7 called a post oxide film is formed on a surface of the polysilicon gate electrode 205. The n$^+$ source region 217 and the n$^+$ drain region 227 are formed by doping an n type impurity such as P to have high impurity concentration of about $6 \times 10^{18}$ to $1 \times 10^{21}$ cm$^{-3}$.

An interlayer insulating film 8 such as SiO$_2$ film, phosphosilicate glass (PSG) film, borophosphosilicate glass (BPSG) film, or their composite film is formed over the n$^+$ source region 217, the n$^+$ drain region 227 and the polysilicon gate electrode 205. Contact holes are formed in the interlayer insulating film 8 to reach the n$^+$ source region 217 and the n$^+$ drain region 227 respectively. Plug electrodes 231, 232 formed of polysilicon, tungsten (W), tungsten silicide (WSi$_2$), or the like are formed in the contact holes. A source electrode interconnection consisting of a titanium-aluminum (TiAl) film 152 with (111) orientation and an aluminum (Al) film or an aluminum alloy film 153 with (111) orientation is formed so as to contact to the plug electrode 231. A drain electrode interconnection consisting of a TiAl film 142 with (111) orientation and an Al film or an aluminum alloy film 143 with (111) orientation is formed so as to contact to the plug electrode 232, and is connected to devices formed in other active regions, or is connected to power supply wirings, etc.

Figure 3B:
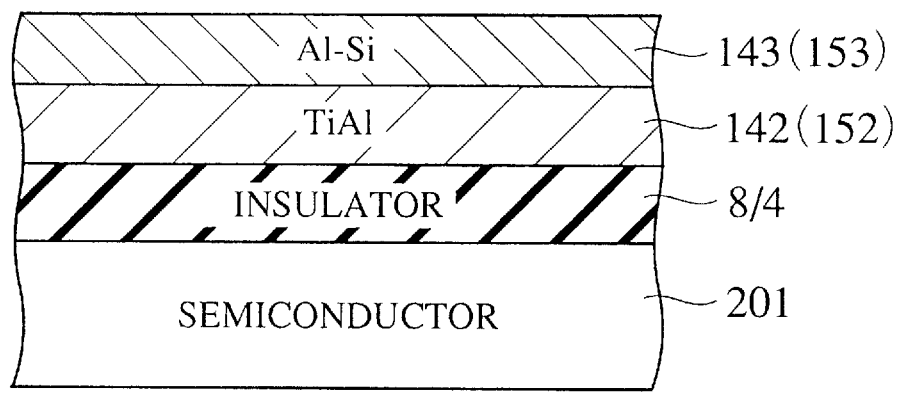
FIG. 3B is an enlarged sectional view showing the interconnection on the MOSFET in FIG. 3A.

FIG. 3B shows schematically the source electrode interconnection 152/153 and the drain electrode interconnection 142/143 of the MOSFET in FIG. 3A. Of course, the Al interconnection according to the first embodiment of the present invention is not limited to the electrode interconnection of the MOSFET shown in FIG. 3A, but is true of bipolar transistor, SIT (Static Induction Transistor), GTO, IGBT, and others if they have a structure similar to that shown in FIG. 3B.

Figure 4:
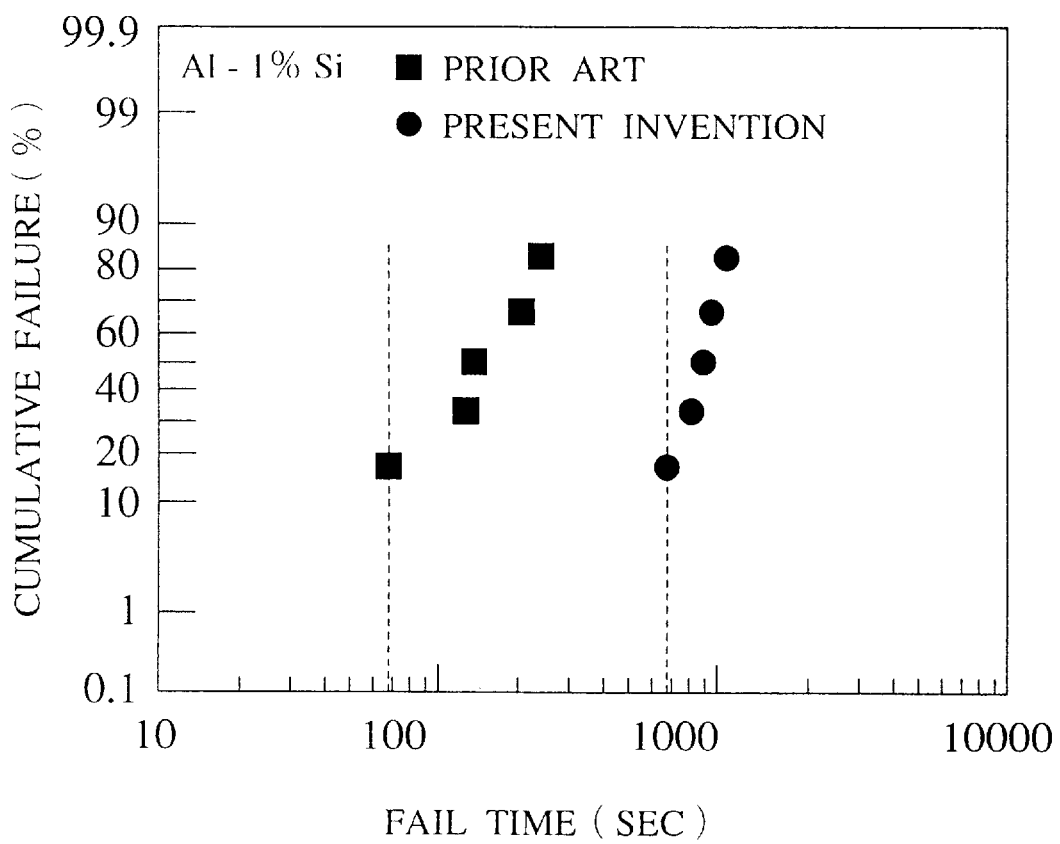
FIG. 4 is a graph showing electromigration endurance of an Al-1% Si interconnection with high (111) orientation which is formed on a titanium-aluminum film according to the present invention in contrast to that in the prior art.

FIG. 4 shows the electromigration endurance of a metal interconnection pattern having the same structure as the source electrode interconnection 152/153 and the drain electrode interconnection 142/143 according to the present invention, which are evaluated by TEG (Test Element Group) patterns for the MOSFET shown in FIG. 3A, fabricated with the same manner.

Dimensions of the metal interconnection of TEG patterns used to evaluate electromigration endurance are set to 500 $\mu$m in length and 1.5 $\mu$m in width, and a thickness of the Al-1% Si film is 2 $\mu$m. Evaluation conditions are controlled such that a substrate temperature is 200° C. and a constant current is supplied to have current density of $1.5 \times 10^7$ (A/cm$^2$). In FIG. 4, measured results of electromigration endurance of the interconnection in the prior art are also included for the sake of comparison with the use of a ■ mark. It would be appreciated that, if compared with the Al-1% Si interconnection in the prior art shown by the ■ mark, the Al-1% Si interconnection with high (111) orientation which is formed on the TiAl film by virtue of epitaxial growth according to the present invention and shown by a ● mark exhibits extremely longer electromigration fail time and less variation in fail time.

As discussed above, according to the first embodiment of the present invention, it can be seen that, if the Al—Si film with (111) preferred orientation is formed as the source/drain electrode interconnections on the TiAl film with (111) preferred orientation, the MOSFET which is superior in electromigration endurance and achieves high reliability can be accomplished.

This is because a lattice constant of the Al film formed by face-centered cubic crystal is 0.405 nm, which is substantially equal to a lattice constant of the TiAl film. More particularly, as shown in FIG. 5, the Al film or aluminum alloy film formed on the TiAl film show good lattice matching such as about 0.991 (99.1%) with the TiAl film on respective (111) axes (i.e., a lattice constant of the Al film (111) is 0.573 nm while a lattice constant of the TiAl film (111) is 0.568 nm) and therefore the Al film or aluminum alloy film and the TiAl film can be formed by virtue of epitaxial growth. At this time, the Al film or aluminum alloy film may take over the (111) orientation which is the same orientation of the TiAl film formed as the under-metal layer. With the use of the TiAl film as the under-metal layer for the Al film, it is possible to form the aluminum film with higher (111) orientation and narrower FWHM of (111) peak detected by the X-ray diffraction compared to the Al film in the prior art which is stacked directly on the silicon oxide film as the under layer.

Figure 6A:
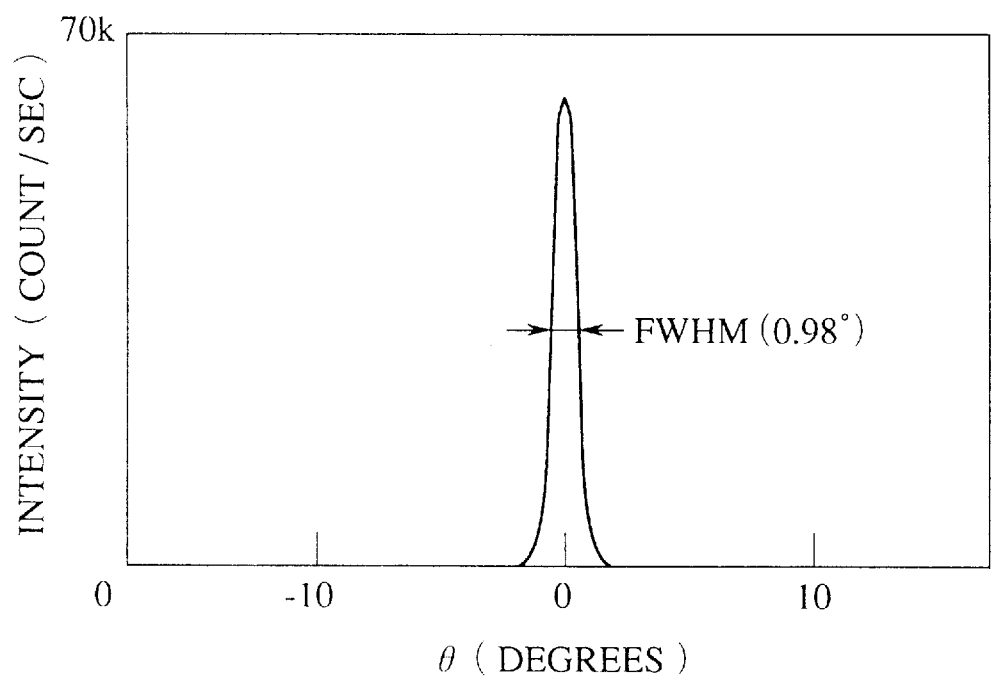
FIG. 6A is a sketch illustrating an X-ray diffraction rocking curve of the metal interconnection according to the present invention after being annealed at 400° C. for ten minutes in nitrogen gas ambient.
Figure 6B:
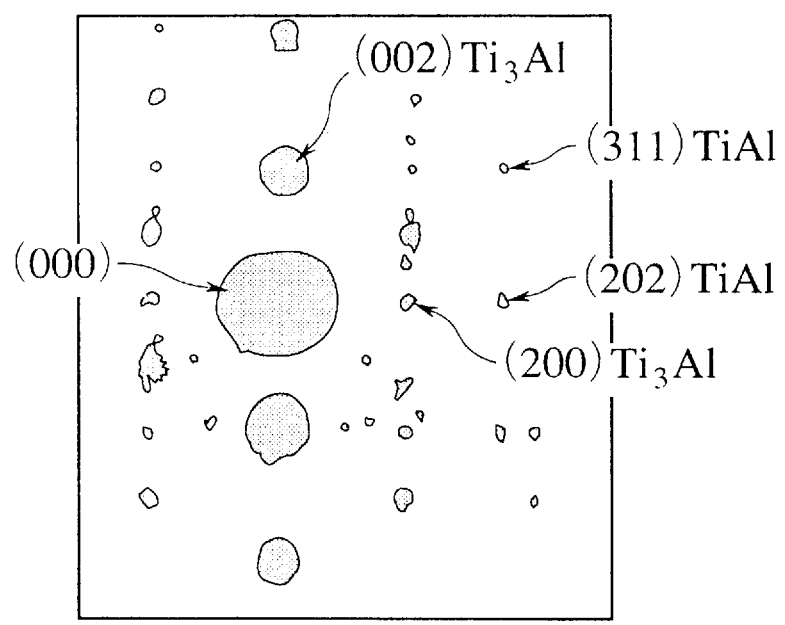
FIG. 6B is a sketch illustrating an electron diffraction pattern of the metal interconnection according to the present invention after being annealed at 400° C. for ten minutes in nitrogen gas ambient.

In addition, after the metal interconnection formed according to the first embodiment of the present invention is annealed at 400° C. for ten minutes in nitrogen gas ambient, X-ray diffraction and electron diffraction are carried out. FIG. 6A shows the rocking curve measured by the X-ray diffraction, while FIG. 6B shows the diffraction image measured by the electron diffraction. From the results obtained by the X-ray diffraction spectrum in FIG. 6A, it can be understood that orientation of the Al—Si film and FWHM of (111) peak are seldom changed after annealing. From the results obtained by the electron diffraction image in FIG. 6B, it can be understood that reaction between the Al—Si film and the Ti film or TiAl film proceeds and Ti$_3$Al is then formed.

According to these results, it can be deduced that, once the Al—Si film with high (111) orientation has been formed on the TiAl film with (111) orientation, the degree of orientation of the Al—Si film was not so deteriorated irrespective of the progress of reaction of the TiAl film even if the Al—Si film is annealed at a temperature less than a melting point, and therefore such an aluminum interconnection structure can be achieved that is excellent in electromigration endurance and is able to achieve high reliability.

FIGS. 7A to 7J are views showing manufacturing steps to explain a method of manufacturing the MOSFET according to the first embodiment of the present invention.

Figure 7A:
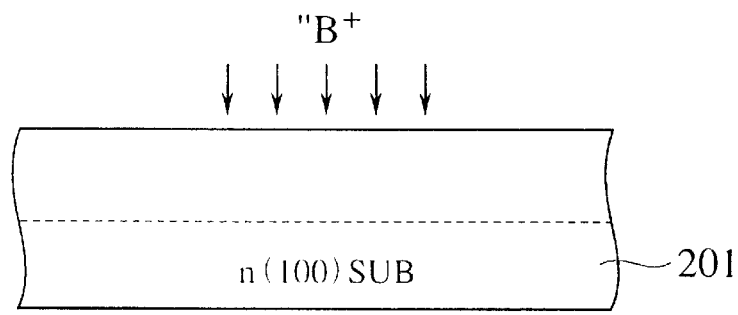
FIGS. 7A to 7J are sectional views showing manufacturing steps to explain a method of manufacturing the MOSFET according to the first embodiment of the present invention.
Figure 7B:
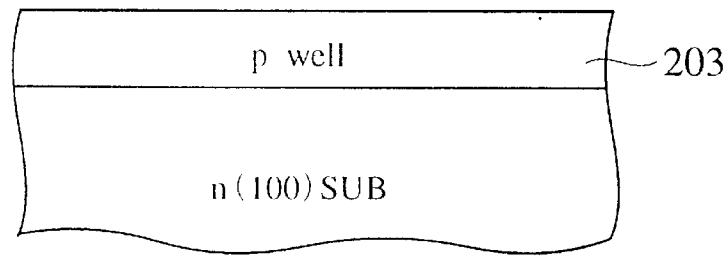

(a) First, as shown in FIG. 7A, $^{11}$B$^+$ is ion-implanted into an n type (100) silicon substrate 201 at an accelerating voltage Vac=130 kV and a dose $\Phi=5\times10^{12}$ to $5\times10^{13}$ cm$^{-2}$. Then, as shown in FIG. 7B, a p well 203 is formed by annealing (drive-in) at 1100° C. for one hour.

Figure 7C:
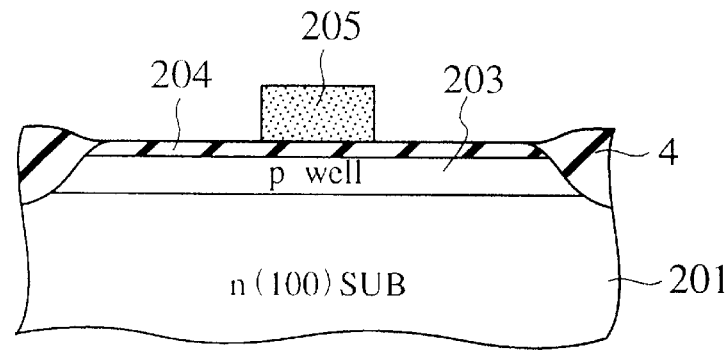

(b) Subsequently, as shown in FIG. 7C, with the use of selective oxidation technique such as LOCOS method, the oxide film 4 for device isolation is formed deeply so as to pass through the p well 203, so that adjacent devices are electrically isolated. In the case of devices with high integration density, other device isolation techniques such as BOX (Buried OXide) method may be used. Ion implantation and drive-in of the p well may be carried out after formation of the oxide film 4 for device isolation. After this, a gate oxide film 204 is formed to have a thickness of 10 nm and a phosphorus-doped polysilicon 205 is deposited by CVD to have a thickness of 300 nm. With the use of photolithography and RIE, as shown in FIG. 7C, a gate electrode 205 having a gate length of 0.5 $\mu$m is formed.

Figure 7D:
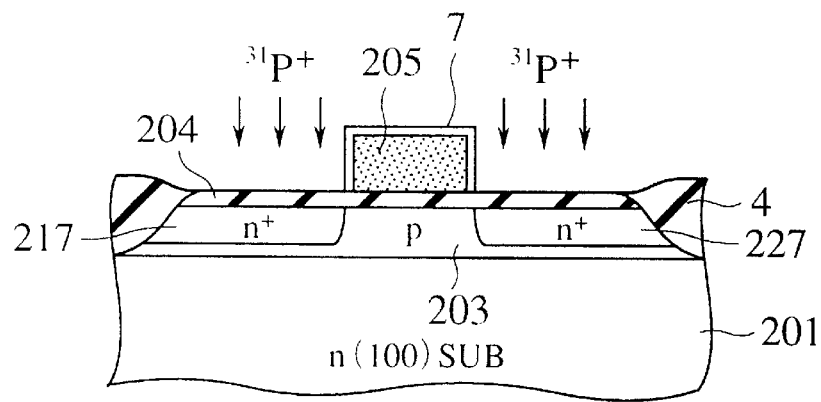

(c) Next, a post oxide film 7 of 10 nm in thickness is formed, and $^{31}$P$^+$ is ion-implanted into at an accelerating voltage Vac=30 kV and a dose $\Phi=3\times10^{15}$ cm$^{-2}$. Then, as shown in FIG. 7D, an n$^+$ source region 217 and an n$^+$ drain region 227 are formed by annealing the implanted substrate at 850° C. for thirty minutes.

Figure 7E:
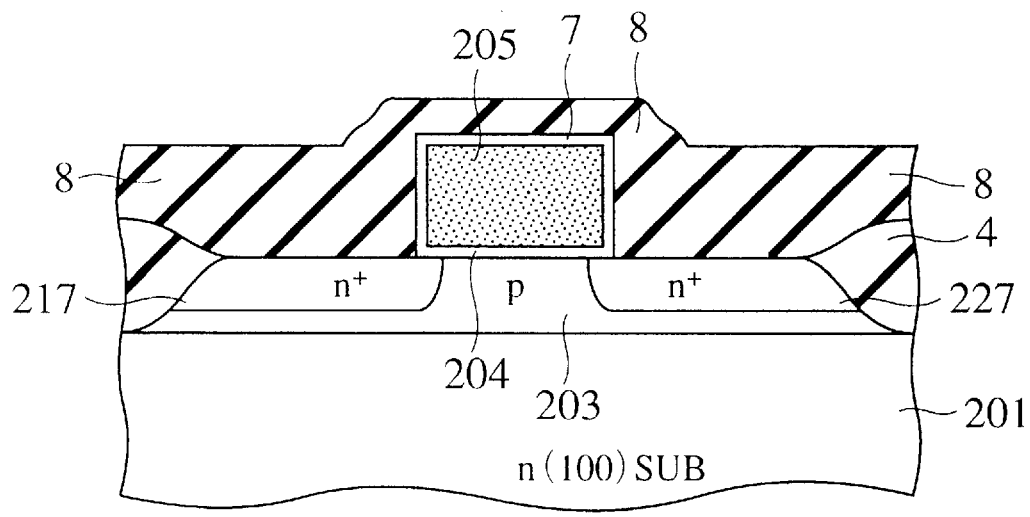
Figure 7F:
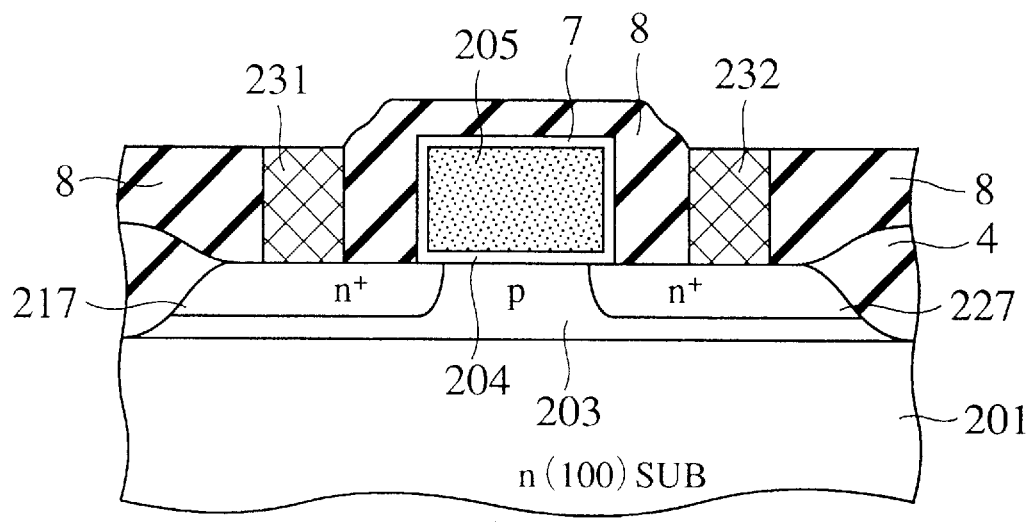

(d) Then, as shown in FIG. 7E, an interlayer insulating film 8 formed of an SiO$_2$ film or a composite film consisting of the SiO$_2$ film and a PSG film is deposited by CVD to have a thickness of 300 to 500 nm. Contact holes are opened in the interlayer insulating film 8. As shown in FIG. 7F, so-called plug electrodes 231, 232 are formed in the contact holes by filling a polysilicon which is doped with n type impurity such as P or As (doped polysilicon), refractory metal such as W, or refractory metal silicide such as WSi$_2$ into the contact holes.

Figure 7G:
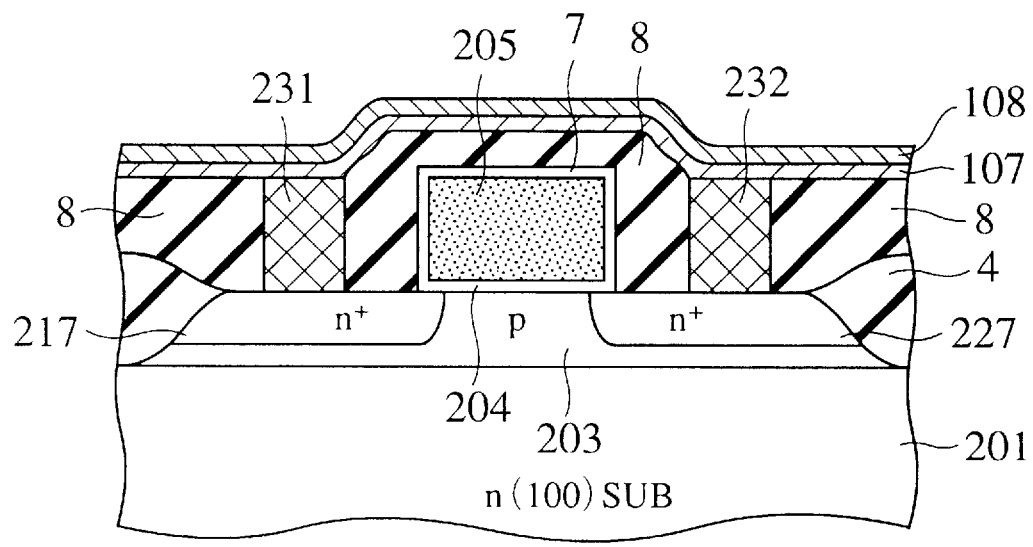
Figure 7H:
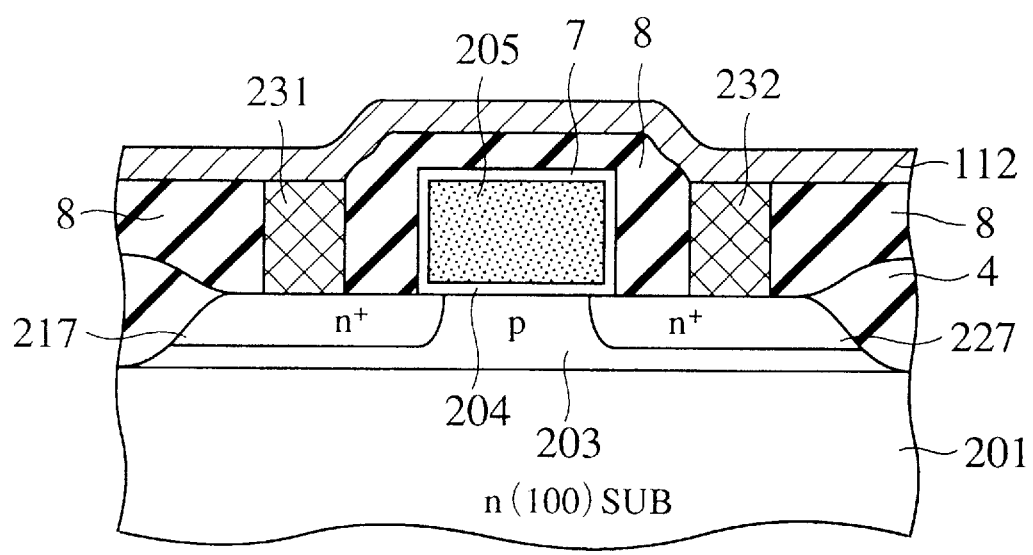

(e) Then, as shown in FIG. 7G, a 100 nm thick Ti film 107 is deposited on the interlayer insulating film 8 and the plug electrodes 231, 232 by DC magnetron sputtering or EB evaporation. Then, as shown in FIG. 7G, a 150 nm thick Al-1% Si film 108 is deposited at a substrate temperature of 260° C. or more by DC magnetron sputtering or EB evaporation. Alloying between the Ti film 107 and the Al-1% Si film 108 is caused by depositing the Al-1% Si film 108 at a high temperature of more than 260° C. so that, as shown in FIG. 7H, a TiAl film 112 with (111) orientation is formed. In this event, no trouble is caused if unreacted Ti film 107 and unreacted Al—Si film 108 remain in lower and upper portions respectively.

In place of the step shown in FIG. 7G, the TiAl film 112 may be directly deposited by DC magnetron sputtering or EB evaporation using a TiAl target. Otherwise, the TiAl film 112 may be deposited by CVD using either Ti compound gas such as $TiCl_4$, TDMAT, or TDEAT, or Al compound gas such as TMA, TIBA, or DMAH. The TiAl film 112 formed as above has (111) orientation which is stable in respect of surface energy.

More particularly, although the TiAl film has a tetragonal crystal structure called as $L1_0$ type, it has a lattice constant of 0.398 nm on an a axis and a lattice constant of 0.405 nm on a c axis. Therefore, since lattice constants on the a and c axes are substantially equal to each other, the crystal structure of the TiAl film is close to the face-centered cubic crystal structure. As a result, when the TiAl is formed as a thin film, it assumes (111) orientation which is most stable in respect of energy. In addition, although the melting point of the TiAl film may depend on a composition ratio of Ti and Al, it may range from 1350° C. to 1450° C. if the composition of Al atoms is within the range of about 49% to about 56%. Such melting point of the TiAl film is relatively higher than the melting point (about 660° C.) of the Al film or the Al alloy film used in the interconnection. Accordingly, under the heating condition for forming the interconnection of the semiconductor device, i.e., in case the semiconductor substrate is heated at less than 600° C. to form the film, the TiAl is hard to agglomerate and is thus ready to be formed as a continuous film from an early stage of the initial process for film formation. This results in a shorter island-like growth period of the TiAl film in contrast to the conventional Al film or Al alloy film which is directly deposited on the underlayer silicon oxide ($SiO_2$) film. Namely, the TiAl film on the $SiO_2$ film is easy to have (111) orientation in contrast to the Al film on the $SiO_2$ film, and is therefore easy to be formed as the continuous film with (111) preferred orientation from an early stage of the initial process for film formation. For this reason, a (111) crystal surface constituting the TiAl film is parallel, not inclined, to a film surface.

Figure 7I:
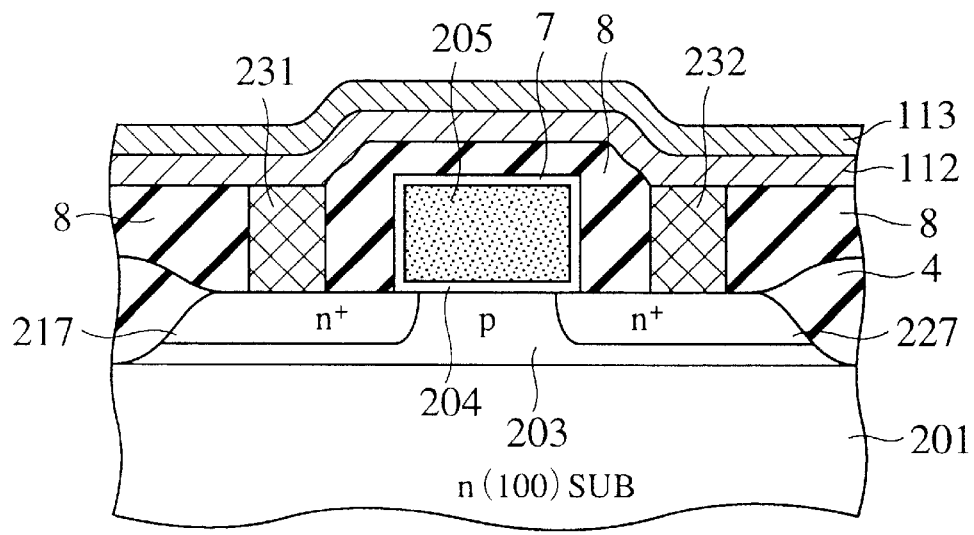

(f) Next, as shown in FIG. 7I, an Al-1% Si film 113 of 1 to 2 μm in thickness is formed on the TiAl film 112 by sputtering, EB evaporation, CVD, or the like. In this event, in order to form the Al film 113 with (111) orientation on the TiAl film 112 with (111) orientation by virtue of epitaxial growth, it is preferable that, after the TiAl film 112 with (111) orientation is formed, the surface of the TiAl film 112 must be prevented from reacting to atmosphere, oxygen, carbon, or nitrogen, and from being exposed to adsorbable gas until the Al film 113 with (111) orientation is formed. It is thus preferable to form continuously the TiAl film 112 and the Al film 113 in the same vacuum chamber. Instead of the Al film 113 with (111) orientation, the aluminum alloy film including any of copper, palladium, titanium, scandium, and boron, or a plurality of these elements by 0.1 to 4% may be used. Of course, the pure Al film 113 may be used.

Figure 7J:
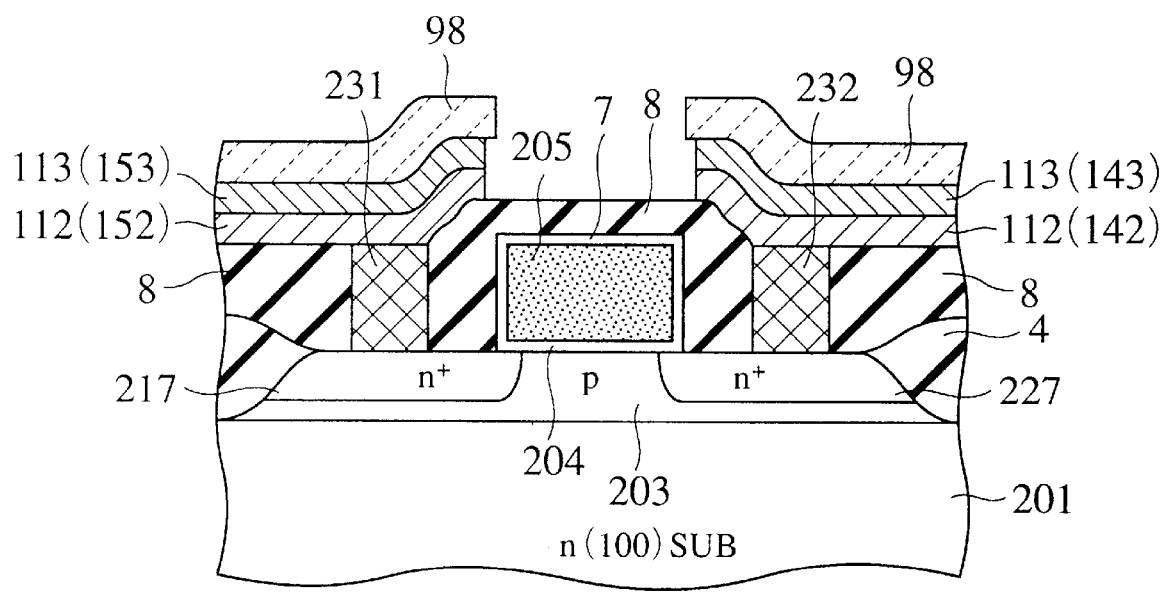

(g) Next, a photoresist 98 is coated on the Al film 113 with (111) orientation and is patterned into profiles of source electrodes 153, 152 and drain electrodes 143, 142. With the use of etching gas such as $Cl_2$, $BCl_3$, $SiCl_4$, $SiCl_4/Cl_2$, $BCl_3/Cl_2$, or $HBr/Cl_2$, the TiAl film 112 and the Al—Si film 113 are selectively etched by RIE using the photoresist 98 as a mask. As shown in FIG. 7J, profiles of source electrodes 153, 152 and drain electrodes 143, 142 are thus completed. The MOSFET according to the first embodiment of the present invention can be finished by removing the photoresist 98, as shown in FIG. 3A.

Second Embodiment

Figure 8A:
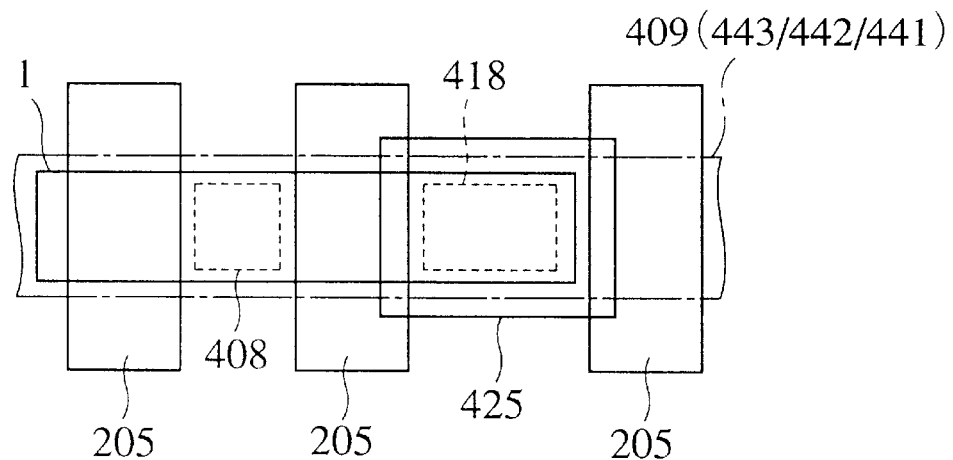
FIG. 8A is a plan view showing a MOSDRAM according to a second embodiment of the present invention.
Figure 8B:
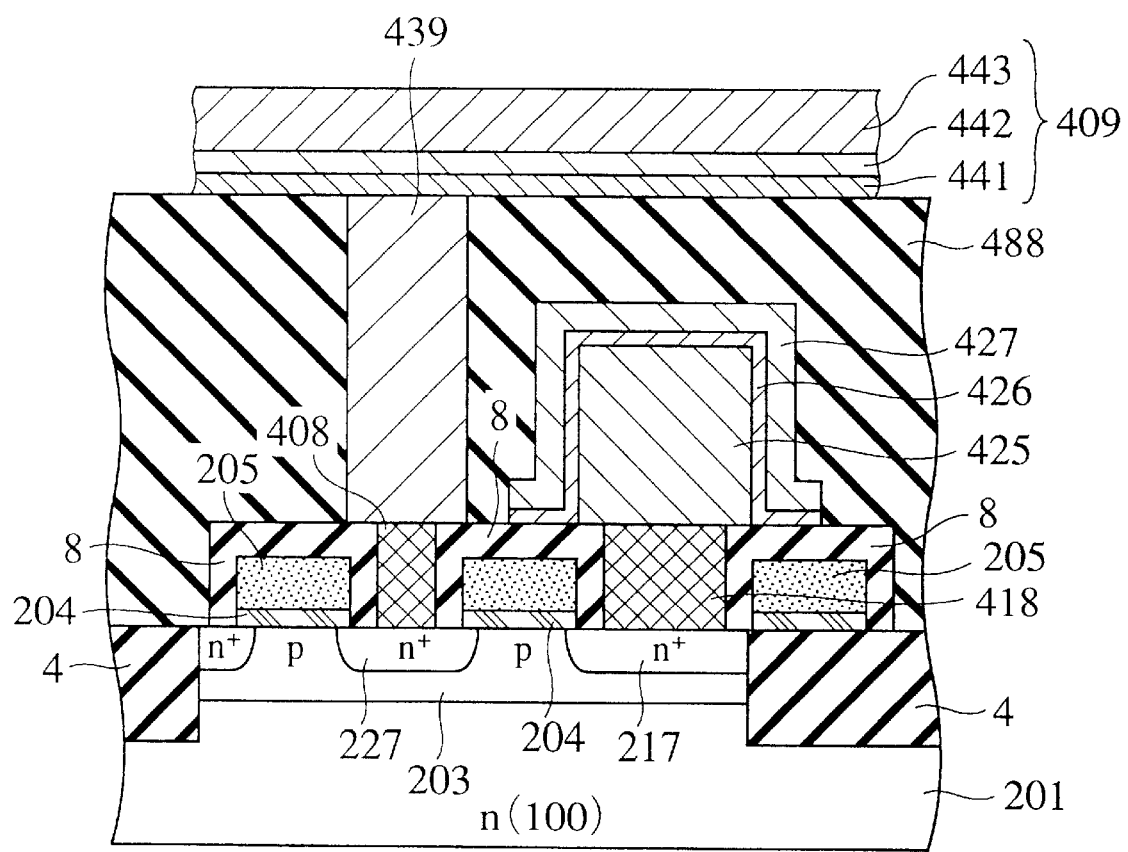
FIG. 8B is a sectional view showing the MOSDRAM in FIG. 8A.

FIGS. 8A and 8B show a plan structure and a sectional structure of a MOSDRAM according to a second embodiment of the present invention. FIG. 8A is a plan view of the MOSDRAM, and FIG. 8B is a sectional view of the MOSDRAM in FIG. 8A. In FIG. 8B, a p well 203 is formed on an n type (100) silicon substrate 201. The p well 203 is surrounded by the device-isolation oxide film 4 formed by BOX, and the like. An inside of the oxide film 4 is used as an active region (device region) 1 so as to form a unit cell. FIG. 8B is a view showing a sectional structure around the active region 1. The $n^+$ source region 217 and the $n^+$ drain region 227 constituting a select transistor (a switching transistor) of the unit cell of the DRAM are formed in the active region 1. The p well region between the $n^+$ source region 217 and the $n^+$ drain region 227 of the select transistor of the unit cell is used as the channel region 203. The gate electrode 205 such as polysilicon is formed over the channel region 203 via the gate oxide film 204. As shown in FIG. 8A, the gate electrode 205 such as polysilicon is also used as the word line. The first interlayer insulating film 8 such as oxide film is formed on the word line. Contact electrodes (first plug electrodes) 408, 418 such as W, $WSi_2$, $TiSi_2$, or $MoSi_2$ are formed in the first contact holes formed in the first interlayer insulating film 8 so as to contact with the $n^+$ source region 217 and the $n^+$ drain region 227. A storage electrode 425 formed of a metal such as Ru, W, Ti, or Pt, or metal silicide of these metals, or conductive metal oxide of these metals is formed on the contact electrode 418. As for the conductive metal oxide, $RuO_2$, $SrLaTiO_3$, and so on may be used. The storage electrode 425 may be formed of a multilayered film which is made of a doped polysilicon (DOPOS) film and a Ti/TiN film formed on the DOPOS film. An opposing electrode (plate electrode) 427 is then formed via a capacitance insulating film 426, thus forming a capacitor portion of the DRAM. With the use of silicon oxide ($SiO_2$) film, tantalum oxide ($Ta_2O_5$) film, strontium titanate ($SrTiO_3$) film, barium titanate ($BaTiO_3$) film, aluminum oxide ($Al_2O_3$) film, or silicon nitride ($Si_3N_4$) film, the capacitance insulating film 426 may be formed. Otherwise, with the use of BSTO film which is solid solution of $SrTiO_3$ (STO) and $BaTiO_3$ (BTO), or composite film of the silicon nitride ($Si_3N_4$) film and the silicon oxide ($SiO_2$) film, the capacitance insulating film 426 may also be formed. Titanium nitride (TiN) film, Ru film, $RuO_2$ film, or silicide film such as $WSi_2$, $MoSi_2$, or $TiSi_2$ may be used as the opposing electrode (plate electrode) 427. Further, a composite film such as $RuO_2$/Ru film or $RuO_2$/Ru/TiN/W film may be used as the opposing electrode 427. The plate electrode 427, the capacitance insulating film 426, and the storage electrode 425 may constitute the storage capacitor portion of the MOSDRAM.

A second interlayer insulating film 488 is formed on the storage capacitor portion and the first interlayer insulating film 8. The second interlayer insulating film 488 is formed of $SiO_2$ film, PSG film, BPSG film, or $Si_3N_4$ film, or composite film (multilayered film) made of a combination of these two films or more. A second contact hole is opened in the second interlayer insulating film 488 so as to touch the first plug electrode 408. A second plug electrode 439 such as doped polysilicon, W, or $WSi_2$ is buried in the second contact hole.

Figure 8C:
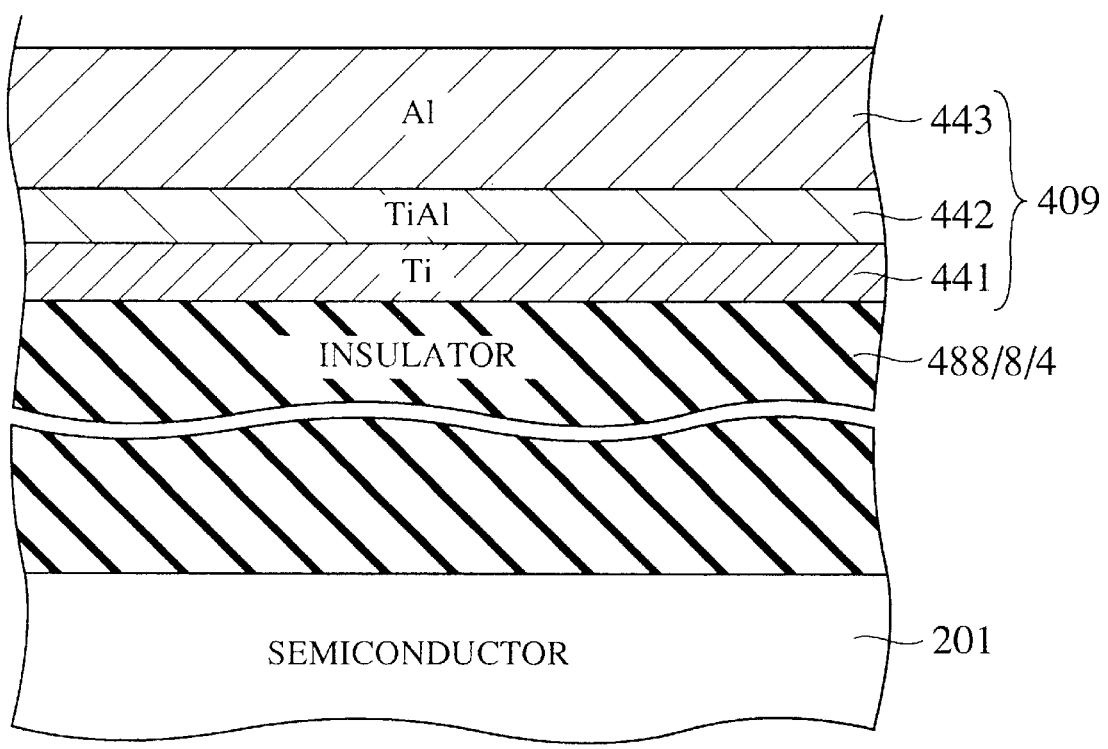
FIG. 8C is an enlarged sectional view showing a bit line of the MOSDRAM in FIG. 8A.

A Ti film 441 is formed on the second interlayer insulating film 488 such that a part of the Ti film 441 is connected to the second plug electrode 439. A TiAl film 442 with (111) orientation is formed on the Ti film 441 to contact with the Ti film 441. An Al film 443 with (111) orientation is formed on the TiAl film 442 by virtue of epitaxial growth. The Al film 443, the TiAl film 442, and the Ti film 441 may constitute a data line (bit line) 409 of the MOSDRAM, which is connected to other unit cells. FIG. 8C shows schematically the bit line 409 of the MOSDRAM according to the second embodiment of the present invention. Metal interconnection of the present invention is not limited to the bit line of the MOSDRAM, but may be applied to various semiconductor devices, for instance, an integrated circuit such as SRAM, EEPROM, TTL, or IIL, or a discrete device such as bipolar transistor, FET, or SIT if they have a basic structure as shown in FIG. 8C.

As shown in FIG. 8C, when the TiAl film 442 with (111) orientation is formed on the insulating film 488/8/4 via the Ti film 441 and the Al film or Al alloy film 443 is then formed on the TiAl film 442, an Al film or aluminum alloy film such as Al—Si or Al—Cu—Si with high (111) orientation, which has a lattice constant substantially identical to that of the TiAl film 442, can be formed by virtue of epitaxial growth. As a result, the Al film or Al alloy film would have high (111) orientation and narrow FWHM in X-ray diffraction spectra to thus improve electromigration endurance, so that the aluminum interconnection structure for the semiconductor device having high reliability can be obtained. Besides, the aluminum alloy film including any of silicon, copper, palladium, titanium, scandium, and boron, or a plurality of these elements by 0.1 to 4% may be used as the aluminum alloy film 443 with (111) orientation.

Especially, as shown in FIG. 8C, if the TiAl film 442 is formed on the Ti film 441, it becomes readily to form the TiAl film with (111) orientation, so that the metal interconnection structure having good electromigration endurance and high reliability can be formed by the Al film or Al alloy film with high (111) orientation.

The MOSDRAM according to the second embodiment of the present invention may be formed by following manufacturing steps.

(a) First the p well 203 is formed by ion-implanting $^{11}B^+$, $^{49}BF_2^+$, etc. into the n type (100) silicon substrate 201 and then carrying out drive-in. The device-isolation oxide film 4 is formed by LOCOS, BOX, and the like to isolate electrically adjacent devices (The p well 203 may be formed after the device-isolation oxide film 4 is formed). Thereafter, the gate oxide film 204 is formed to have a thickness of 10 nm, and the phosphorous-doped polysilicon film 205 is formed by LPCVD, etc. on a surface of the gate oxide film 204 to have a thickness of 0.3 $\mu$m. By patterning the polysilicon film 205 by lithography or RIE, the polysilicon gate electrode 205 is formed on the gate oxide film 204 to have a gate length of 0.5 $\mu$m. Next, the n$^+$ source region 217 and the n$^+$ drain region 227 are formed by ion-implanting $^{31}P^+$ or $^{75}As^+$ at an accelerating voltage Vac=30 kV and a dose $\Phi$=3×10$^{15}$ cm$^{-2}$ and annealed at 850° C. for thirty minutes. Then the 200 to 300 nm thick SiO$_2$/PSG film is deposited by CVD to form the first interlayer insulating film 8. As the case in the standard MOSDRAM, p$^+$ channel stop implantation, channel dope implantation, etc. may be effected as the case may be, and their descriptions are omitted. The first contact holes are opened in the SiO$_2$/PSG film 8. The first contact electrodes (first plug electrodes) 408, 418 are formed by depositing the 200 to 400 nm thick n$^+$ doped polysilicon layer (in which As is doped) or the 200 to 400 nm thick W film in the contact holes by CVD.

Figure 9A:
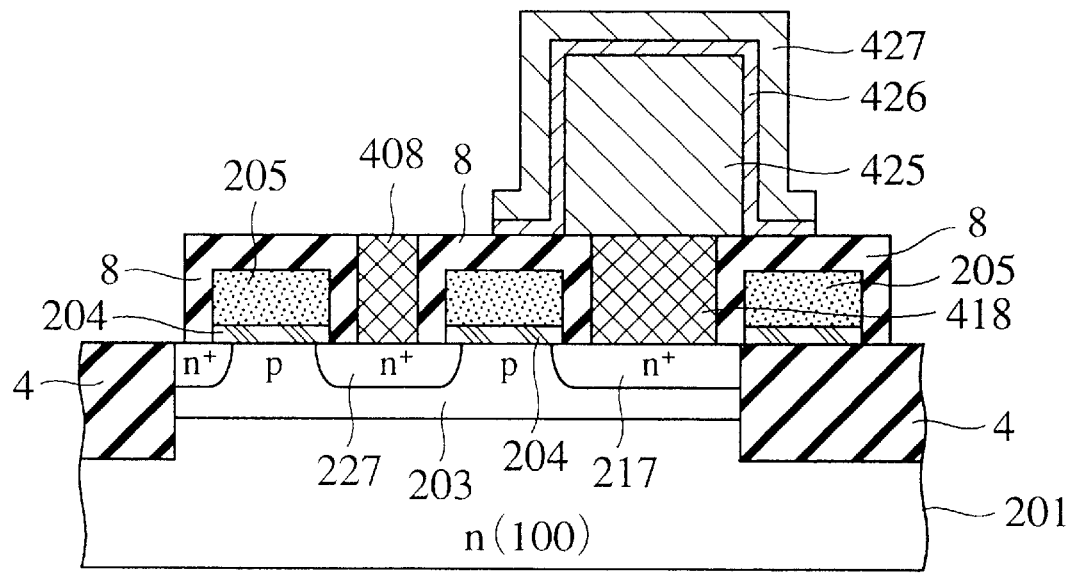
FIGS. 9A to 9D are sectional views showing manufacturing steps to explain a method of manufacturing the MOSDRAM according to the second embodiment of the present invention.

(b) Next, the conductive metal oxide such as RuO$_2$, etc., n$^+$ doped polysilicon film, or W film is CVD-deposited thereon and the Ti/TiN barrier metal layer is then RF sputter-deposited. With the use of photolithography, the photoresist patterns are formed on the Ti/TiN barrier metal in a storage electrode forming region of the capacitor portion. Using the photoresist as a mask, the barrier metal layer is etched by RIE employing BCl$_3$, CF$_4$, SF$_6$, CCl$_4$, or the like and simultaneously the conductive metal oxide, n$^+$ doped polysilicon film, or W film formed beneath the barrier metal layer is etched to pattern the profile of the storage electrode 425, as shown in FIG. 9A. Subsequently, after the photoresist is removed and the entirety of the resultant structure is rinsed, a 50 nm thick Pt film, a 30 nm thick BSTO film 426, a 150 nm thick W film 427 are RF sputter-deposited to cover an upper portion and side wall portions of the storage electrode 425. CVD, or the like may be used in place of RF sputtering. Next, photoresist is coated on an entire surface of the resultant structure. By making use of the photolithography using the photoresist film as a mask, the W film 427 serving as the opposing electrode (plate electrode) is etched into the pattern shown in FIG. 9A by RIE employing CF$_4$. Then, with the use of predetermined etchant such as mixed aqueous solution of hydrogen peroxide, ammonia water, and EDTA, the BSTO film 426 is etched and patterned using the W film 427 as an etching mask. Then, with the use of etchant consisting of iodine/cetyl pyridinium iodide(CPI)/benzene and heated at 60° C., the platinum layer is patterned by RIE employing CF$_4$ using the BSTO film 426 as an etching mask.

Figure 9B:
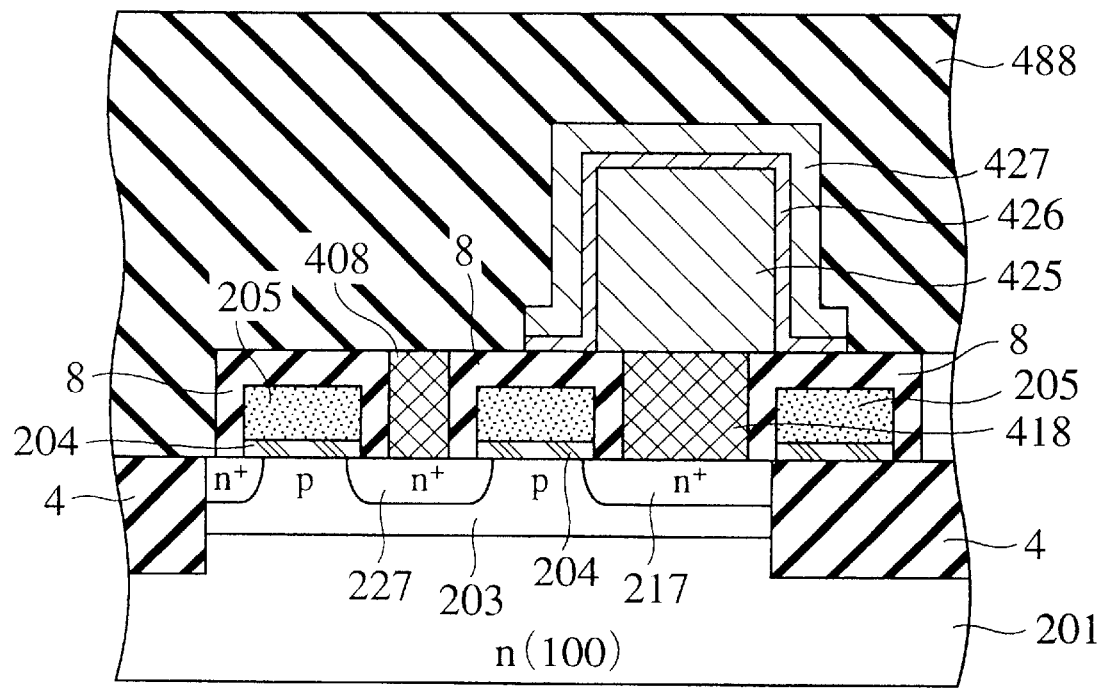
Figure 9C:
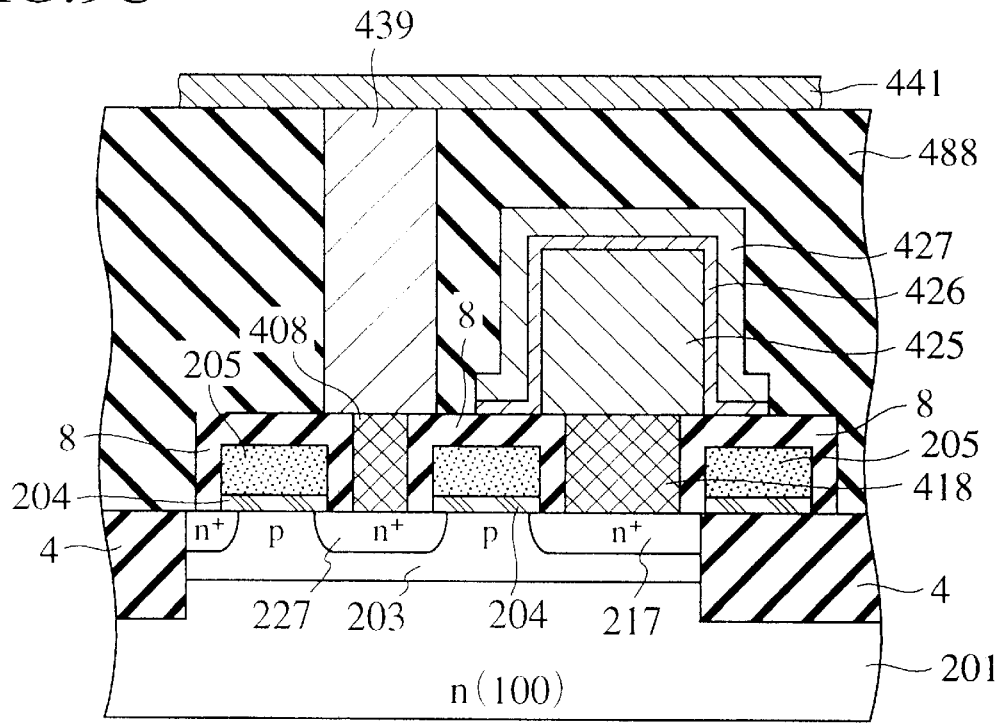

(c) Next, as shown in FIG. 9B, the second interlayer insulating film 488 formed of SiO$_2$ film, PSG film, BPSG film, or the like is deposited by CVD, SOG (Spin On Glass), etc. The second contact hole is opened to expose the first contact electrode 408 (formed on the n$^+$ drain region 227). The DOPOS film or the WSi$_2$ film is deposited by selective CVD to fill the second contact hole in the second interlayer insulating film 488. As a result, as shown in FIG. 9C, the second plug electrode 439 is formed. In place of selective CVD, the DOPOS film or the like is deposited on an overall surface, then planalized by either etched back or CMP (Chemical Mechanical Polishing) so as to bury into the contact hole.

Next, as shown in FIG. 9C, the Ti film 441 is formed to have a thickness of 250 nm. To form the titanium film 441, sputtering, evaporation, etc. may be used using a titanium target.

Figure 9D:
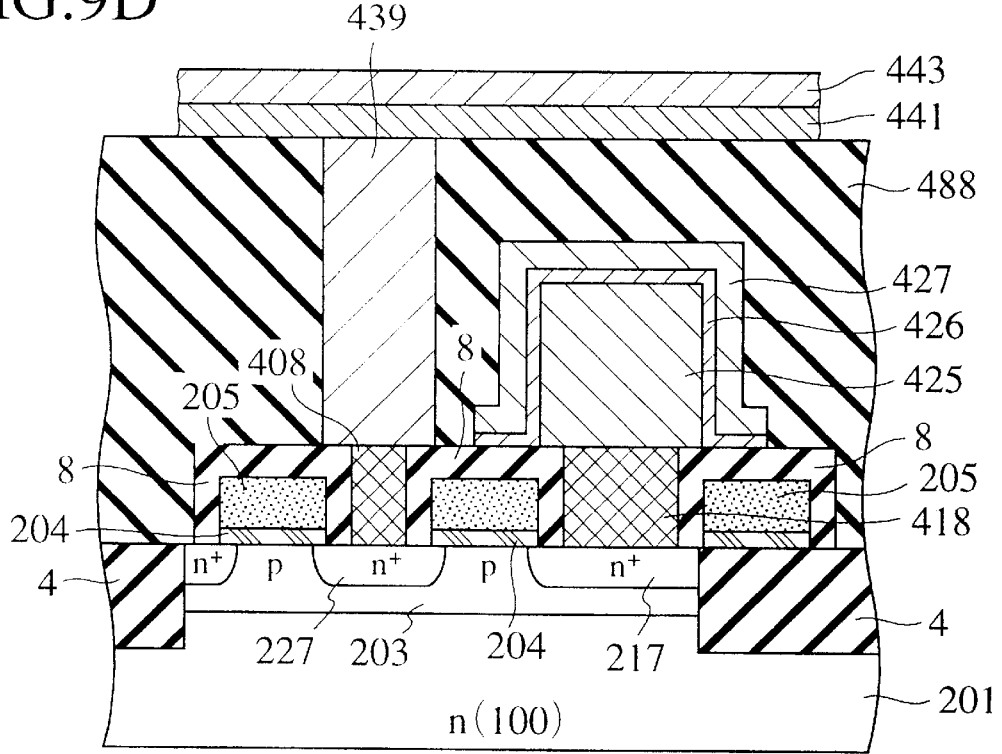

(d) Next, as shown in FIG. 9D, the Al film 443 is formed on the Ti film 441. At this time, it is preferable that, after the titanium film 441 is formed, the surface of the Al film 443 must be prevented from reacting to atmosphere, oxygen (O$_2$), carbon (C), or nitrogen (N$_2$), and from being exposed to adsorbable gas until the Al film 443 is formed.

Like the Ti film 441, sputtering, evaporation, or the like may be used to form the Al film 443. In addition, upon forming the Al film 443, the Ti film 441 and the Al film 443 react to each other by heating the semiconductor substrate 201, so that, as shown in FIG. 8B, the TiAl film 442 with (111) orientation is formed on the boundary between the Ti film 441 and the Al film 443. It is preferable that, like the first embodiment, a heating temperature of the semiconductor substrate 201 must be set to more than 260° C. At this time, since the TiAl film 442 has (111) orientation, the Al film 443 formed continuously on the TiAl film 442 with (111) orientation has also (111) orientation because it is formed by virtue of epitaxial growth.

In addition, by controlling an initial thickness of the Ti film 441, the heating temperature of the semiconductor substrate 201 upon forming the Al film 443 with (111) orientation, and film forming rate of the Al film 443 with (111) orientation, film forming rate and film thickness of the TiAl film 442 with (111) orientation can be controlled. Accordingly, by controlling these film forming conditions, the aluminum interconnection structure may be formed either as the structure wherein the Ti film 441 is left in the lowest layer of the interconnection, as shown in FIG. 8C, or the structure wherein the Ti film 441 is not left in the lowest layer of the interconnection, as explained in the first embodiment and shown in FIG. 3B.

(e) Next, photoresist is coated on the Al film 443 with (111) orientation and then patterned by photolithography. If, using the photoresist as a mask, the Al film 443 with (111) orientation, the TiAl film 442 with (111) orientation, and the Ti film 441 are etched by RIE employing $Cl_2$, $BCl_3$, etc., the bit line 409 is patterned, whereby the MOSDRAM according to the second embodiment of the present invention has been finished, as shown in FIGS. 8A and 8B.

In the structure having the Ti film 441 as the underlayer of the TiAl film 442 according to the second embodiment of the present invention, the TiAl film 442 is formed due to alloying reaction between the Ti film 441 and the Al film 443. Therefore, since Al atoms become easy to migrate on the surface of the Ti film irrespective of whether the Ti film 441 remains as the final metal interconnection structure or not, step coverage of the Al film can be improved on recessed or stepped portions including the contact portions.

Third Embodiment

FIG. 10 is an enlarged sectional view showing a metal interconnection around a contact hole according to a third embodiment of the present invention. In FIG. 10, an $n^+$ diffused region 216 is formed on a part of a surface of the n type (100) substrate 201. The interlayer insulating film 8 made of $SiO_2$, PSG, BPSG, or their combination is formed on the surface of the n type (100) substrate 201. A contact hole is formed in the interlayer insulating film 8 to get to the $n^+$ diffused region 216. A $TiSi_2$ film 165 is formed at the bottom of the contact hole to reduce ohmic resistance. The Ti bottom film 107, a TiN film 166, the TiAl film 142 with (111) orientation, and an Al film 113 with (111) orientation are formed in this order on the $TiSi_2$ film 165. In lieu of the Al film 113 with (111) orientation, the aluminum alloy film including any of silicon, copper, palladium, titanium, scandium, and boron, or a plurality of these elements by 0.1 to 4% may be used. These aluminum alloy films have also (111) orientation.

In FIG. 10, it is a matter of course that the $n^+$ diffused region 216 may be replaced with a $p^+$ diffused region, or the $n^+$ diffused region 216 may be formed in a p region such as p well. Although not shown in FIG. 10, an intermediate Ti film may be formed between the TiAl film 142 and the TiN film.

The structure according to the third embodiment of the present invention shown in FIG. 10 will be manufactured as follows.

(a) First, with the use of photolithography, the $n^+$ diffused region 216 is formed on the n type (100) substrate 201 by ion implantation or predeposition. Then, the interlayer insulating film 8 made of $SiO_2$ film, PSG film, BPSG film, or the like is formed by thermal oxidation, CVD, SOG, or the like. With the use of photolithography and RIE or ECR ion etching, the contact hole is opened to reach the $n^+$ diffused region 216.

(b) Next, the Ti bottom film 107 is deposited into the contact hole by making use of DC magnetron sputtering. If an aspect ratio of the contact hole is high, directivity of sputtering may be improved by providing a honey-comb or cylindrical collimeter between the sputtering target and a sample to be deposited. If a temperature of the n type (100) substrate 201 is raised up to 400° C. when sputtering is carried out using this collimeter (collimeter sputtering), good step coverage can be obtained. Then, the $TiSi_2$ film 165 is formed by silicidation anneal at the bottom of the contact hole with IR lamp, or the like.

(c) Similarly, the TiN film 166 is formed by collimeter-sputtering at a substrate temperature of 400° C. Otherwise, the TiN film 166 may be formed by CVD using $TiCl_4$ and $NH_3$, TDMAT and $NH_3$, or the like. If the contact hole has a high aspect ratio, CVD is preferred since better step coverage can be obtained. In addition, the TiN film 166 may be formed on the surface of the Ti film 107 by annealing the Ti film 107 in nitrogen ($N_2$) ambient after the Ti film 107 is formed. At this time, the Ti film 107 may be eliminated by replacing the Ti film 107 with the TiN film 166 totally. The TiN film 166 may also be formed by reactive sputtering in $N_2$ atmosphere or by ECR-CVD using $TiCl_4$ in $N_2$ atmosphere.

(d) Then, when the TiAl film 142 is deposited on the TiN film 166 by sputtering using the TiAl target, EB evaporation, or CVD, the TiAl film 142 with most stable (111) orientation in view of energy can be achieved.

(e) If the Al film 113 is deposited on the TiAl film 142 with (111) orientation, the Al film 113 may be formed by virtue of epitaxial growth so as to have the same (111) orientation as that of the TiAl film 142 since a lattice constant of Ti is close to that of TiAl.

(f) After this, if RIE or ECR ion etching is carried out using the etching mask such as photoresist, the metal interconnection according to the third embodiment has been finished.

According to the structure shown in FIG. 10, electromigration endurance can be improved, and at the same time the capability for preventing the generation of the alloy pit on the boundary between the diffused layer 216 and the metal interconnection can be enhanced much more by the two-layered film of the TiN film 166 and the Ti film 107. And the silicon solid phase epitaxial growth on the boundary is greatly suppressed. Therefore, according to the third embodiment of the present invention, the metal interconnection structure having good electromigration endurance and high reliability can be achieved.

In the multilayered interconnection film consisting of a under-metal film having high reactivity with Al and an upper wiring metal formed of Al, there is a problem that, if a thickness of the under-metal film exceeds 50 nm, poor morphorogy appears on the surface of the under-metal film and therefore the degree of (111) orientation of the Al film formed on the under-metal film is degraded. According to the third embodiment of the present invention, since the TiAl film 142 is formed on the Ti/TiN film 107/166 and then the Al film 113 is formed thereon by virtue of epitaxial growth, it is feasible to improve the degree of (111) orientation of the Al film 113 even if the Ti film of 100 nm in thick, for example, is applied as the under-layer. Therefore, a thickness of the under-metal film can be assured sufficiently and good ohmic contact can be accomplished even when the under-metal film such as Ti film, TiN film, or the like is applied as the barrier metal between Al and silicon in the contact portion shown in FIG. 10.

Even in the semiconductor device in which contact holes having high aspect ratio are formed, the under-metal film having a sufficient thickness can be formed on the bottom portions and side wall portions of the contact holes and the aluminum film with good (111) orientation can be formed regardless of a thickness of the under-metal film on the flat portion.

Fourth Embodiment

Figure 11A:
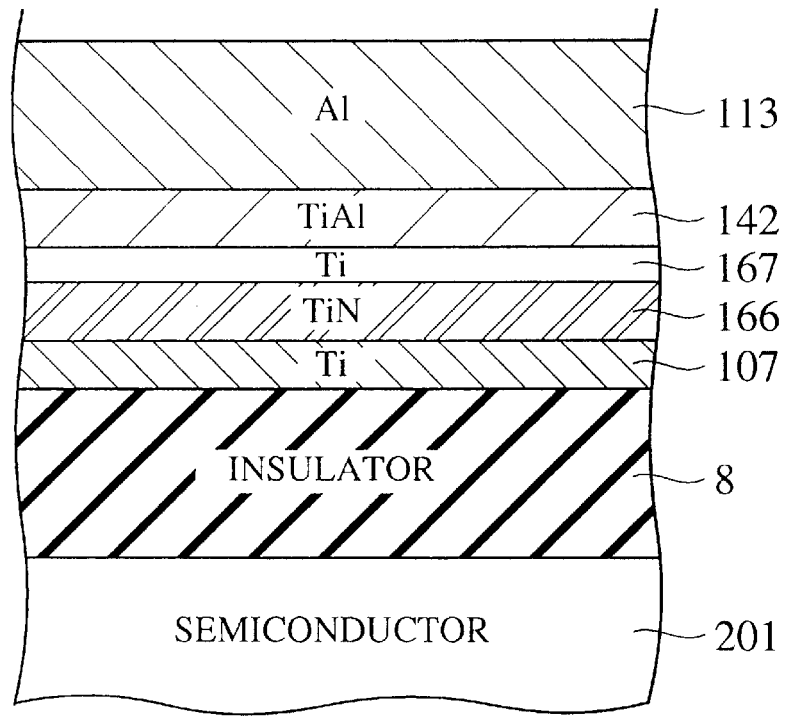
FIGS. 11A to 11D are schematic sectional views showing metal interconnection according to a fourth embodiment of the present invention.

FIG. 11A shows an example of the metal interconnection according to a fourth embodiment of the present invention.

In FIG. 11A, the insulating film 8 is formed on the semiconductor substrate 201. As the insulating film 8, silicon oxide film, PSG film, BPSG film formed by CVD, thermal oxide film or SOG coated film, or the like, or any combination of these films, for example, may be used. The Ti film (the second Ti film) 107 and the TiN film 166 are formed on the insulating film 8. In addition, the Ti film (the first Ti film) 167 is formed on the TiN film 166 and the TiAl film 142 with (111) orientation is then formed on the first Ti film 167. The Al film or Al alloy film 113 with (111) orientation is formed as the uppermost layer. As the Al film, the aluminum alloy film including any of silicon, copper, palladium, titanium, scandium, and boron, or a plurality of these elements by 0.1 to 4% may be used.

As shown in FIG. 11A, by using the three-layered film as an under-layer film formed of the second Ti film 107, the TiN film 166, and the first Ti film 167, the TiAl film 142 with (111) orientation can be readily formed. Accordingly, electromigration endurance of the metal interconnection formed of the Al film or the Al alloy film 113 with high (111) orientation on the TiAl film 142 can be improved, and the aluminum interconnection structure having high reliability can also be achieved. Furthermore, if the structure shown in FIG. 11A is formed in the contact hole portion, failures due to alloy pits generated on the boundary between the semiconductor substrate 201 and the metal interconnection as well as silicon solid phase epitaxial growth can be controlled or suppressed by the TiN film 166.

In addition, no problem of an upper limit of the thickness of the under-metal film exists, which is the problem in the conventional method using highly reactive metal to Al as the under-film. In the prior art using highly reactive metal to Al as the under-film, if a thickness of the under-metal film exceeds 50 nm, the irregularity and the ruggedness appear on the surface of the under-metal film and therefore (111) orientation of the Al film formed on the under-metal film is degraded. However, according to the fourth embodiment of the present invention, since the TiAl film is formed on the Ti film, TiN film and then the Al film is formed thereon by virtue of epitaxial growth, it is possible to improve (111) orientation of the Al film even if the Ti film of 100 nm thick is applied as the under-layer, for instance. Thus, a thickness of the under-metal film can be assured sufficiently even when the under-metal film is applied as the barrier metal between Al and silicon in the contact portion.

Even in the semiconductor device in which contact holes having high aspect ratio are formed, the under-metal film having a sufficient thickness can be formed on the bottom portions and side wall portions of the contact holes and the aluminum film with good (111) orientation can be formed regardless of a thickness of the under-metal film on the flat portion.

The metal interconnection according to the fourth embodiment of the present invention, shown in FIG. 11A, will be manufactured hereinbelow.

(a) First, the insulating film 8 made of $SiO_2$ film, PSG film, BPSG film, etc., or a combination of these films is formed on the semiconductor substrate 201 such as Si by thermal oxidation, CVD, sputtering, SOG, or the like.

(b) Then, the second Ti film 107 and the TiN film 166 are formed. After the second Ti film 107 is formed by sputtering, evaporation, or the like, the TiN film 166 may be formed by annealing in nitrogen atmosphere, CVD using $TiCl_4$ and $NH_3$, TDMA and $NH_3$, etc., or reactive sputtering or ECR-CVD in nitrogen atmosphere. Further, it is possible to form the two-layered structure of the second Ti film 107 and the TiN film 166 by annealing the surface side of the second Ti film 107 in nitrogen atmosphere. Then, the first Ti film 167 is formed on the TiN film 166.

(c) Subsequently, the TiAl film 142 with (111) orientation is formed on the first Ti film 167 and the aluminum film 113 with (111) orientation is then formed on the TiAl film 142. Like the second embodiment, upon forming the Al film 113, the first Ti film 167 and the Al film 113 react to each other by heating the semiconductor substrate 201, so that the TiAl film 142 is formed on the boundary between the first Ti film 167 and the Al film 113 at the early stage of formation of the Al film 113. Since the TiAl film 142 thus formed has (111) orientation, the Al film 113 formed continuously on the TiAl film 142 also has (111) orientation because it is formed by virtue of epitaxial growth.

(d) Then, by making use of the predetermined etching ask such as photoresist, etching is effected by RIE employing $BCl_3$, $SiCl_4/Cl_2$, $HBr/Cl_2$, or the like to form predetermined wiring patterns, whereby the metal interconnection according to the fourth embodiment of the present invention can be completed.

Figure 11B:
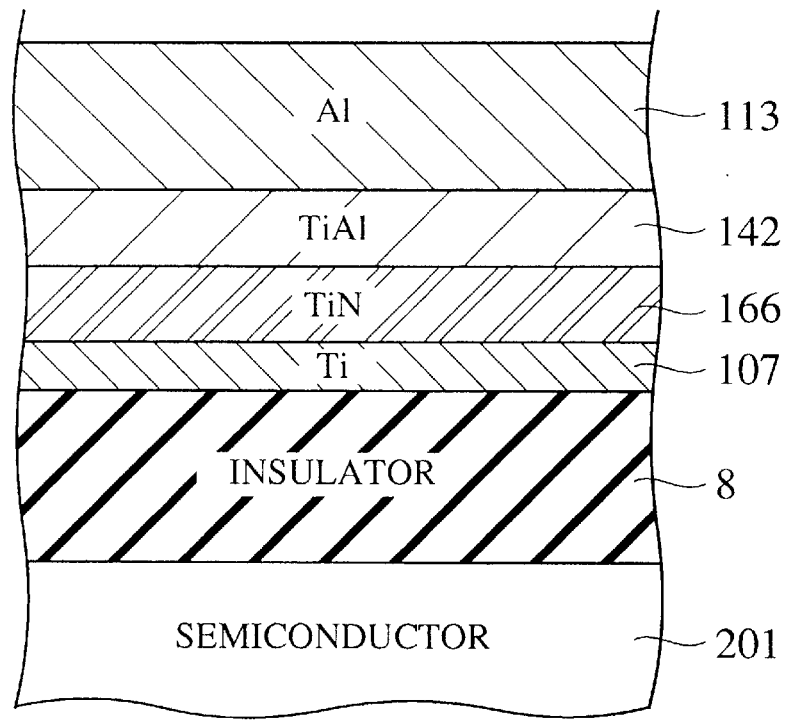

In the fourth embodiment of the present invention, by controlling an initial thickness of the first Ti film 167, the heating temperature of the semiconductor substrate 201 upon forming the Al film 113 with (111) orientation, and film forming rate of the Al film 113 with (111) orientation, the thickness of the TiAl film 142 with (111) orientation can be controlled. Hence, either the structure wherein the first Ti film 167 is left between the TiAl film 142 with (111) orientation and the TiN film 166, as shown in FIG. 11A, or the structure wherein the Ti film is not left between the TiAl film 142 with (111) orientation and the TiN film 166, as shown in FIG. 11B, may be selected by controlling these parameters as the final structure.

Figure 11C:
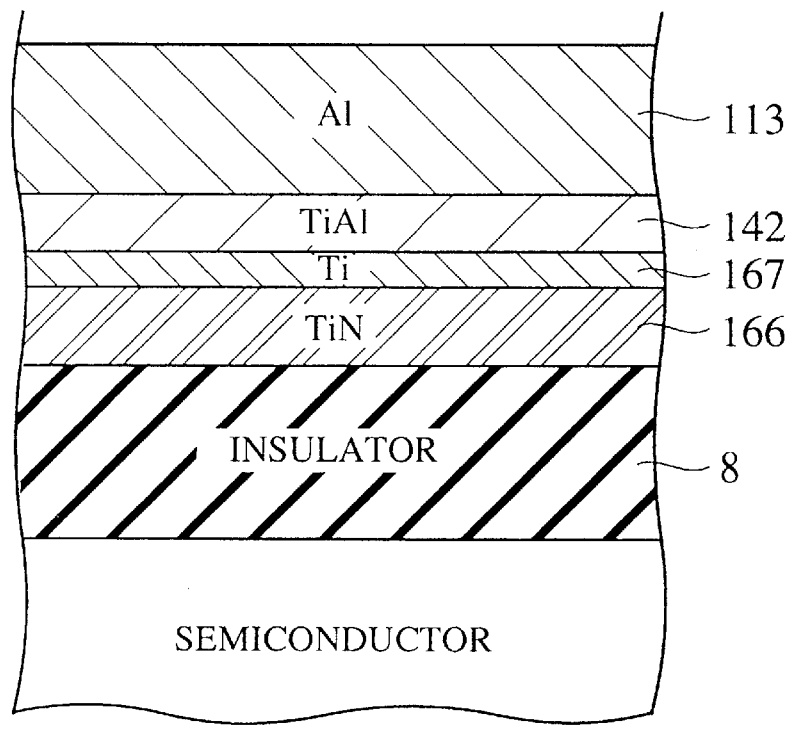
Figure 11D:
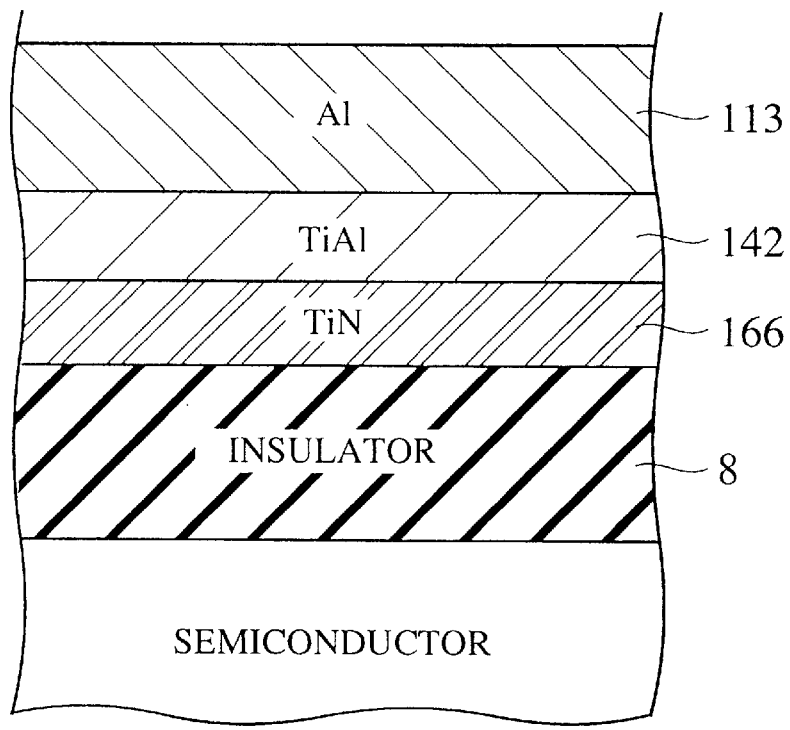

In the structure shown in FIG. 11A, such a structure as shown in FIG. 11C may be adopted that the second Ti film 107 between the TiN film 166 and the insulating film 8 may be omitted. In addition, in the structure shown in FIG. 11B, the object of the present invention can be attained by the structure shown in FIG. 11D wherein the Ti film 107 between the TiN film 166 and the insulating film 8 may be omitted.

Fifth Embodiment

Figure 12D:
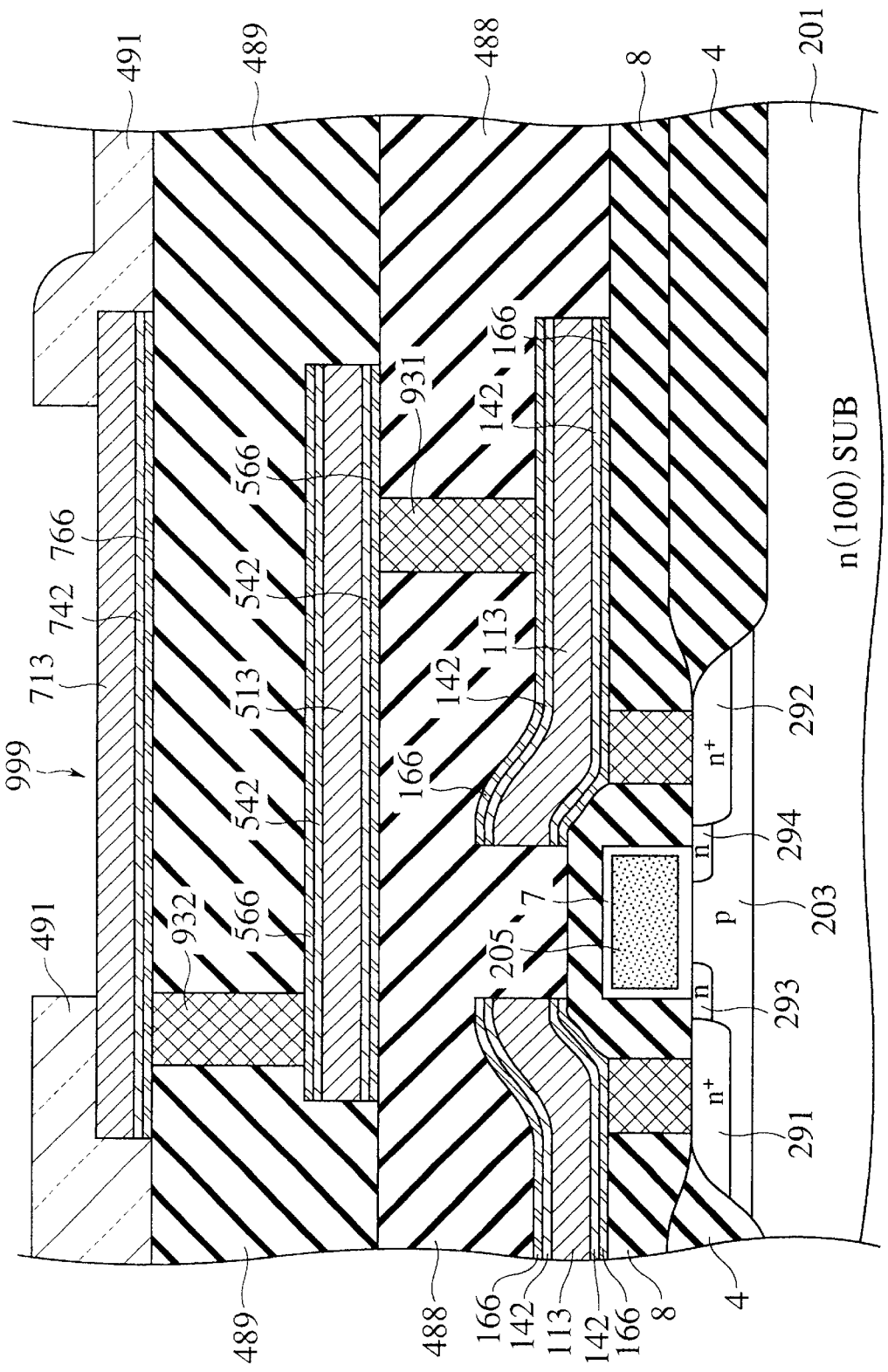
Figure 13:
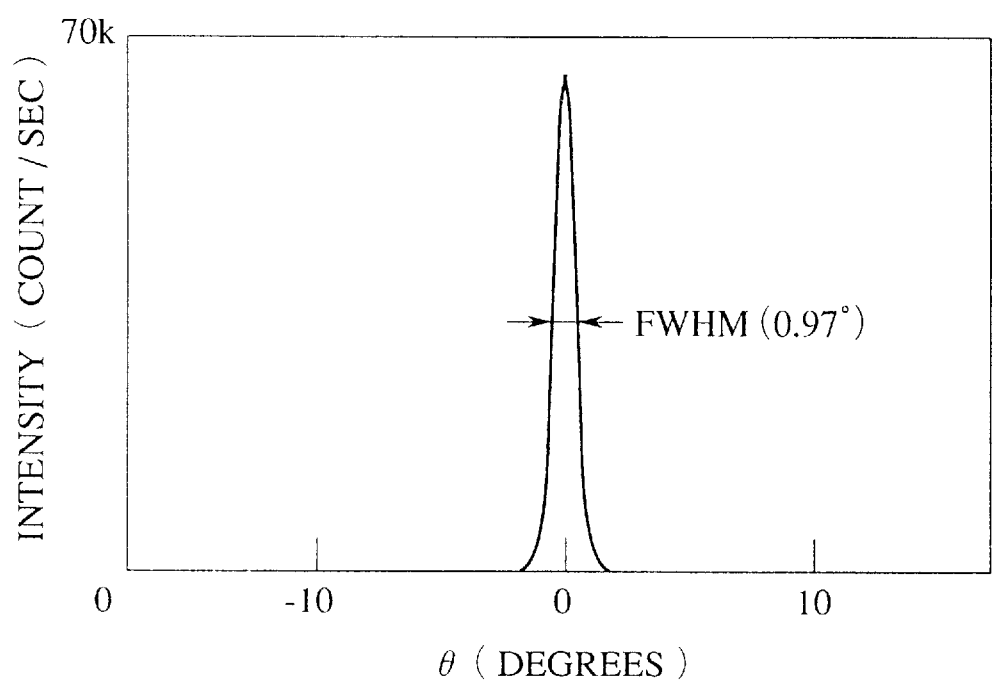
FIG. 13 is a sketch illustrating an X-ray diffraction rocking curve of the metal interconnection for the case that a titanium film and an Al-1% Si film are formed continuously on a silicon oxide film according to the present invention.
Figure 14A:
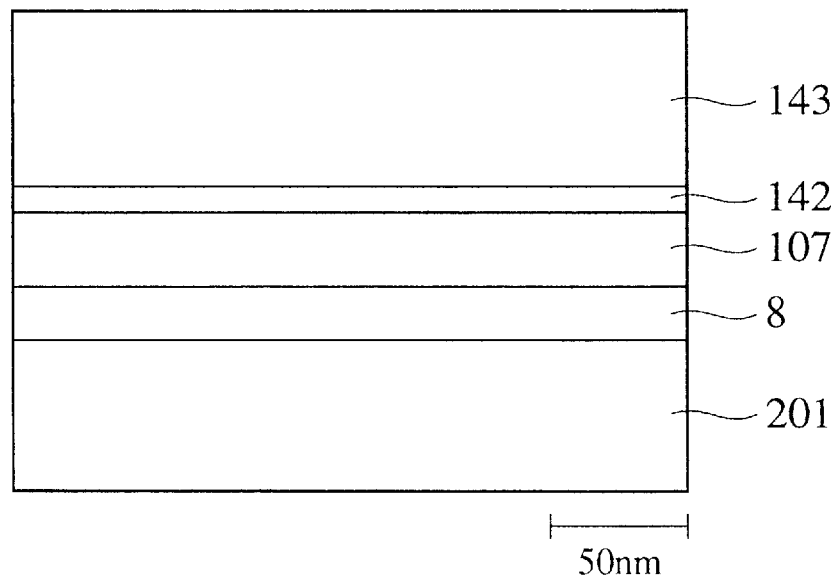
FIG. 14A is a sketch showing a cross-sectional transmission electron microscope (TEM) view of a sample used in measurement of the X-ray diffraction rocking curve shown in FIG. 13.
Figure 14B:
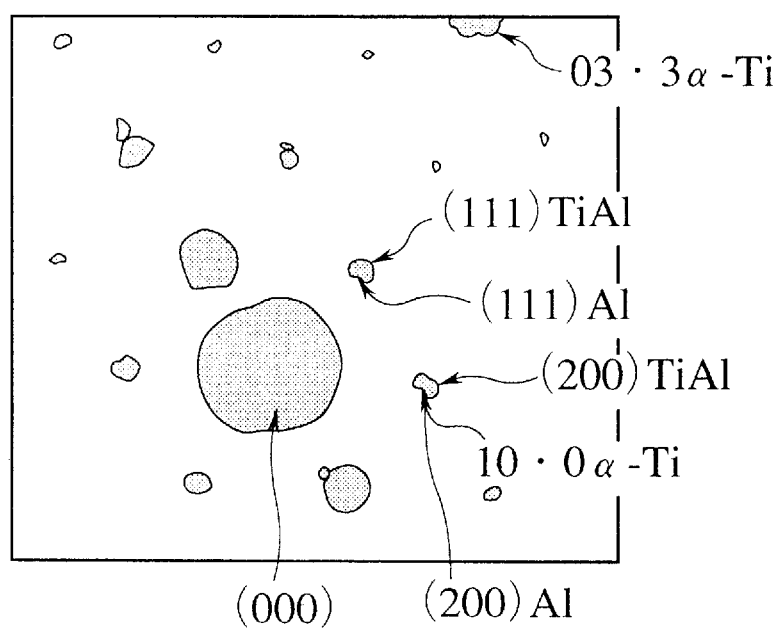
FIG. 14B is a sketch showing an electron diffraction view of the sample in FIG. 14A.

FIGS. 12A to 12D are sectional views showing the MOSFET having three level aluminum interconnection according to a fifth embodiment of the present invention. In FIG. 12A, an n well 283 is formed on a p type (100) silicon substrate 281. The n well 283 is device-isolated by the thermal oxide film 4 which is formed deeply to get to the p type (100) silicon substrate 281 from a surface of the n well 283. In a device-isolated region of the n well 283 serving as an active region, a $p^+$ source region 287 and a $p^+$ drain region 288 are formed. The gate electrode 205 formed of polysilicon or the like is formed over a channel region 283 between the $p^+$ source region 287 and the $p^+$ drain region 288 via the gate oxide film 204. The thin oxide film 7 called as a post oxide film is formed on the surface of the polysilicon gate electrode 205. The $p^+$ source region 287 and the $p^+$ drain region 288 are formed by doping a p type impurity such as B to have high impurity concentration of about $6 \times 10^{18}$ to $1 \times 10^{21}$ $cm^{-3}$.

A first interlayer insulating film 8 such as $SiO_2$ film, PSG film, BPSG film, or their composite film is formed over the $p^+$ source region 287, the $p^+$ drain region 288 and the polysilicon gate electrode 205. First contact holes are formed in the interlayer insulating film 8 to reach the $p^+$ source region 287 and the $p^+$ drain region 288 respectively. A first level metal interconnection layer (a first metal layer)

consisting of a TiN film 166, a TiAl film 142, an Al—Cu—Si film 113 is formed via the first contact holes. The TiAl film 142 and the Al—Cu—Si film 113 have high (111) orientation. A second interlayer insulating film 488 such as SiO$_2$ film, PSG film, BPSG film, or the like is formed on the first metal layer 166/142/113. A second level metal interconnection layer (a second metal layer) consisting of a TiN film 566, a TiAl film 542, an Al—Si film 513 is formed via a second contact hole formed in the second interlayer insulating film 488. A third interlayer insulating film 489 such as SiO$_2$ film, PSG film, BPSG film, Si$_3$N$_4$ film, or the like is formed on the second metal layer 566/542/513. A third level metal interconnection layer (a third metal layer) consisting of a TiN film 766, a TiAl film 742, an Al—Si film 713 is formed via a third contact hole formed in the third interlayer insulating film 489. A final passivation film 491 such as SiO$_2$ film, PSG film, BPSG film, Si$_3$N$_4$ film, polyimide film, or the like is formed on the third metal layer 766/742/713. A portion of the third metal layer 766/742/713 exposed in an opening portion formed in the final passivation film 491 is used as a bonding pad region 999.

As shown in FIG. 12A, if the TiN films 166, 566, 766 are used as the under-layer, the TiAl films 142, 542, 742 with (111) orientation can be readily formed. Accordingly, electromigration endurance of the metal interconnections formed of the Al alloy films 113, 513, 713 with high (111) orientation can be improved, and therefore a multilevel metal interconnection structure having high reliability can be achieved. In particular, although the first metal layer is formed on the first contact hole portion which directly contacts the silicon layer, failures due to alloy pits generated on the boundary between the first metal layer and the p$^+$ source/drain regions 287, 288 as well as the silicon solid phase epitaxial growth can be controlled by the TiN film 166.

In addition, no problem of an upper limit of the thickness of the under-metal film exists, which is the problem in the method using highly reactive metal to Al as the under-film. In the method using highly reactive metal to Al as the under-film, if a thickness of the under-metal film exceeds 50 nm, ruggedness appears on the surface of the under-metal film and therefore the degree of (111) orientation of the Al film formed on the under-metal film is degraded. However, according to the fifth embodiment of the present invention, since the TiAl film 142 with (111) orientation is formed on the TiN film 166 as the under-layer and then the Al film 113 is epitaxially grown thereon, it is possible to improve the degree of (111) orientation of the Al film even if the Ti film of 100 nm in thick is applied as the under-layer, for instance. Thus, even if the TiN film 166 is applied as the barrier metal in the source/drain contact portion of the MOSFET, a thickness of the under-metal film can be assured sufficiently so that a good ohmic contact characteristic can be accomplished.

In the event that the second and third contact holes having high aspect ratio are present between the second metal layer interconnection and the first metal layer, between the third metal layer and the second metal layer, or the like, the under-metal film having a sufficient thickness can be formed on the bottom portions and side wall portions of the contact holes and the aluminum film with strong (111) orientation can be formed regardless of a thickness of the under-metal film on the flat portion.

The first metal layer, the second metal layer, and the third metal layer are not limited to the fifth embodiment of the present invention shown in FIG. 12A, various interconnection structures explained throughout the first to fourth embodiments may be applied.

FIG. 12B shows another example of the structure according to the fifth embodiment of the present invention. In the first metal layer, the Al—Cu—Si film 113 is formed to be sandwiched by the TiAl film 142 and the TiN film 166. In the second metal layer, the Al—Si film 513 is formed to be put between the TiAl films 542. According to such sandwich structure, electromigration endurance can be improved still more, and therefore the semiconductor device having multilevel interconnection can be achieved with high reliability.

FIGS. 12C and 12D shows still other examples of the structure according to the fifth embodiment of the present invention. In FIGS. 12C and 12D, a plug electrode 931 formed of W, WSi$_2$, doped polysilicon, or the like is formed to connect the second metal layer to the first metal layer, and a plug electrode 932 is also formed to connect the third metal layer to the second metal layer. According to the structures in FIGS. 12C and 12D, even if highly reactive metal material to Al or aluminum alloy are used as electrode material for plug electrode, interconnection between metal layers can be achieved with high reliability.

Various modifications will become possible for those skilled in the art after receiving the teachings of the present disclosure without departing from the scope thereof.

What is claimed is:

1. A semiconductor device having a substrate, an insulating film on the substrate and an interconnection disposed on the insulating film, said interconnection comprising:

(a) a titanium-aluminum film with (111) orientation disposed on the insulating film; and (b) an epitaxially grown aluminum film having plural crystal surfaces in parallel, with high (111) orientation disposed on said titanium-aluminum film.

2. The semiconductor device of claim 1, wherein said interconnection further comprising:

a titanium film formed between said insulating film and said titanium-aluminum film.

3. The semiconductor device of claim 2, wherein said interconnection further comprises a titanium nitride film formed between said titanium film and said insulating film.

4. The semiconductor device of claim 2, wherein said interconnection further comprises a two-layered film consisting of a titanium nitride film and a second titanium film under the titanium nitride film, said two-layered film being formed between said insulating film and said titanium-aluminum film.

5. The semiconductor device of claim 1, wherein said interconnection further comprises a titanium nitride film formed between said insulating film and said titanium-aluminum film.

6. The semiconductor device of claim 1, wherein said interconnection further comprises a two-layered film consisting of a titanium nitride film and a titanium film, said two-layered film being formed between said insulating film and said titanium-aluminum film.

7. The semiconductor device of claim 1, wherein a lattice constant of said titanium-aluminum film lies in between 99% to 100% of that of said epitaxially grown aluminum film.

8. The semiconductor device of claim 1, wherein a lattice constant of said titanium-aluminum film lies in between 99% to 100% of that of said epitaxially grown aluminum alloy film.

9. The semiconductor device of claim 1, wherein said titanium-aluminum film contacts said insulating film.

10. The semiconductor device of claim 1, wherein said titanium-aluminum film is disposed on a substantially flat surface of the insulating film.

11. A semiconductor device having a substrate, an insulating film on the substrate and an interconnection disposed on the insulating film, said interconnection comprising:

(a) a titanium-aluminum film with (111) orientation disposed on the insulating film; and (b) an epitaxially grown aluminum alloy film having plural crystal surfaces in parallel with high (111) orientation disposed on said titanium-aluminum film.

12. The semiconductor device of claim 11, wherein said interconnection further comprises a titanium film formed between said insulating film and said titanium-aluminum film.

13. The semiconductor device of claim 12, wherein said interconnection further comprises a titanium nitride film formed between said titanium film and said insulating film.

14. The semiconductor device of claim 12, wherein said interconnection further comprises a two-layered film consisting of a titanium nitride film and a second titanium film under the titanium nitride film, said two-layered film being formed between said titanium film and said insulating film.

15. The semiconductor device of claim 11, wherein said interconnection further comprises a titanium nitride film formed between said insulating film and said titanium-aluminum film.

16. The semiconductor device of claim 11, wherein said interconnection further comprises a two-layered film consisting of a titanium nitride film and a titanium film, said two-layered film being formed between said insulating film and said titanium-aluminum film.

17. The semiconductor device of claim 11, wherein said titanium-aluminum film contacts said insulating film.

18. The semiconductor device of claim 11, wherein said titanium-aluminum film is disposed on a substantially flat surface of the insulating film.

19. A semiconductor device having a substrate, a first interlayer insulating film on the substrate, a first level metal interconnection layer on the first interlayer insulating film, a second interlayer insulating film on the first level metal interconnection layer and a second level metal interconnection layer on the second interlayer insulating film, said first level metal interconnection layer comprising:

(a) a lower titanium-aluminum film with (111) orientation;

(b) an aluminum film having plural crystal surfaces in parallel with high (111) orientation disposed on said lower titanium-aluminum film; and (c) a upper titanium-aluminum film having plural crystal surfaces in parallel with (111) orientation disposed on said aluminum film.

20. The semiconductor device of claim 19, wherein said lower titanium-aluminum film is disposed on a substantially flat surface of the first interlayer insulating film.

21. A semiconductor device having a substrate, a first interlayer insulating film on the substrate, a first level metal interconnection layer on the first interlayer insulating film, a second interlayer insulating film on the first level metal interconnection layer and a second level metal interconnection layer on the second interlayer insulating film, said first level metal interconnection layer comprising;

(a) a lower titanium-aluminum film with (111) orientation;

(b) an aluminum alloy film having plural crystal surfaces in parallel with high (111) orientation disposed on said lower titanium-aluminum film; and (c) a upper titanium-aluminum film having plural crystal surfaces in parallel with (111) orientation disposed on said aluminum alloy film.

22. The semiconductor device of claim 21, wherein said lower titanium-aluminum film is disposed on a substantially flat surface of the first interlayer insulating film.

* * * * *